US012133034B2

United States Patent
Zhou et al.

(10) Patent No.: US 12,133,034 B2
(45) Date of Patent: Oct. 29, 2024

(54) DISPLAY APPARATUS

(71) Applicant: HISENSE VISUAL TECHNOLOGY CO., LTD., Shandong (CN)

(72) Inventors: Hui Zhou, Shandong (CN); Weicai Huang, Shandong (CN); Yingrui Wang, Shandong (CN); Jianxin Yang, Shandong (CN); Haiying Wang, Shandong (CN); Chan Zhang, Shandong (CN)

(73) Assignee: Hisense Visual Technology Co., Ltd., Qingdao (CN)

( * ) Notice: Subject to any disclaimer, the term of this patent is extended or adjusted under 35 U.S.C. 154(b) by 232 days.

(21) Appl. No.: 17/940,511

(22) Filed: Sep. 8, 2022

(65) Prior Publication Data
US 2023/0007374 A1 Jan. 5, 2023

Related U.S. Application Data

(63) Continuation of application No. PCT/CN2021/081822, filed on Mar. 19, 2021.

(30) Foreign Application Priority Data

Apr. 20, 2020 (CN) .......................... 202010310249.8
Sep. 4, 2020 (CN) .......................... 202010922417.9
(Continued)

(51) Int. Cl.
*H04R 25/00* (2006.01)
*H04R 1/02* (2006.01)
(Continued)

(52) U.S. Cl.
CPC ............. *H04R 1/028* (2013.01); *H04R 9/025* (2013.01); *H10K 59/00* (2023.02); *H04R 2499/15* (2013.01)

(58) Field of Classification Search
CPC .... H04R 1/028; H04R 2499/15; H04R 9/025; H04R 1/24; H04R 2440/05; H04R 7/045; H04R 7/06; H04R 7/20
(Continued)

(56) References Cited

U.S. PATENT DOCUMENTS 9,226,057 B1  12/2015  Davis et al.
2006/0120542 A1  6/2006  Lee et al.
(Continued)

FOREIGN PATENT DOCUMENTS

CN  2407544 Y  11/2000
CN  1780494 A  5/2006
(Continued)

*Primary Examiner* — Phylesha Dabney
(74) *Attorney, Agent, or Firm* — Meunier Carlin & Curfman LLC

(57) ABSTRACT

A display apparatus is disclosed in the embodiments of the present disclosure. The display apparatus includes a display structure, a sound emitting substrate, and a plurality of electromagnetic exciters; wherein the display structure is configured to receive and display optical signals; the sound emitting substrate is attached to the display structure and is divided into a plurality of regions by a plurality of isolation zones, at least some of the plurality of regions are attached to at least one of the plurality of electromagnetic exciters; and the plurality of electromagnetic exciters are configured to generate bending waves at an area where the plurality of electromagnetic exciters are attached to the sound emitting substrate.

12 Claims, 20 Drawing Sheets

(30) Foreign Application Priority Data

Nov. 3, 2020 (CN) .......................... 202022505941.4
Nov. 3, 2020 (CN) .......................... 202022506817.X

(51) Int. Cl.
*H04R 9/02* (2006.01)
*H10K 59/00* (2023.01)

(58) Field of Classification Search
USPC .......................................................... 381/388
See application file for complete search history.

(56) References Cited

U.S. PATENT DOCUMENTS

| | | |
|---|---|---|
| 2016/0008852 A1 | 1/2016 | Miyoshi |
| 2018/0052567 A1 | 2/2018 | Miyamoto et al. |
| 2019/0045287 A1 | 2/2019 | Lee et al. |

FOREIGN PATENT DOCUMENTS

| | | |
|---|---|---|
| CN | 201557239 U | 8/2010 |
| CN | 205800436 U | 12/2016 |
| CN | 107175873 A | 9/2017 |
| CN | 206805054 U | 12/2017 |
| CN | 107533408 A | 1/2018 |
| CN | 108462917 A | 8/2018 |
| CN | 208273238 U | 12/2018 |
| CN | 109494475 A | 3/2019 |
| CN | 110149582 A | 8/2019 |
| CN | 210090908 U | 2/2020 |
| CN | 111526452 A | 8/2020 |
| JP | 3599699 B2 | 12/2004 |
| JP | 3877031 B2 | 2/2007 |
| JP | 2019114958 A | 7/2019 |

DISPLAY APPARATUS

CROSS REFERENCE TO RELATED APPLICATIONS

This application is a continuation of International Application No. PCT/CN2021/081822, filed on Mar. 19, 2021, which claims the priorities of Chinese patent application No. 202010310249.8 filed on Apr. 20, 2020; Chinese patent application No. 202022506817.X filed on Nov. 3, 2020; Chinese patent application No. 202022505941.4, filed on Nov. 3, 2020; and Chinese patent application No. 202010922417.9 filed on Sep. 4, 2020. The entire contents of these applications are incorporated herein by reference.

FIELD

The present application relates to display apparatuses, and in particular to a display apparatus.

BACKGROUND

A sound on display (SoD) panel technology is directed to sound-emitting vibrators arranged in a display apparatus, such as a television, and the vibrators emit sound to achieve or sound like effect of a conventional speaker. Now for a display apparatus with a SoD panel, a vibrator on one side is generally set to be a left channel to emit sound, and a vibrator on the other side is generally set to be a right channel to emit sound, thereby achieving an immersive sound-emitting effect of dual channels. However, it is difficult for this sound emitting mode to provide a better immersive experience for users.

SUMMARY

The present application provides a display apparatus, including: an organic light emitting diode (OLED) display structure, an adhesion structure, a sound emitting backplane, and at least one exciter. A first side of the OLED display structure is configured to display optical signals; a second side of the OLED display structure is attached to a first side of the sound emitting backplane through the adhesion structure; the at least one exciter is attached to a second side of the sound emitting backplane, the exciter is configured to enable the sound emitting backplane and the OLED display structure to vibrate to emit sound.

In some embodiments, the adhesion structure includes: a plurality of double-sided adhesive tapes; the plurality of double-sided adhesive tapes are arranged according to a preset rule, and a gap is disposed between two adjacent double-sided adhesive tapes.

In some embodiments, the preset rule includes that the plurality of double-sided adhesive tapes are parallel to a length direction or width direction of an OLED display structure, and are arranged at equal intervals.

In some embodiments, the display apparatus further includes a fixed structure that is arranged on the second side of the sound emitting backplane and is configured to support and fix the OLED display structure and the sound emitting backplane.

In some embodiments, an area of the sound emitting backplane is less than an area of the OLED display structure; wherein a first region of the OLED display structure protruding from the sound emitting backplane includes a printed circuit board (PCB) of the OLED display structure.

In some embodiments, the display apparatus further includes a buffer structure that is arranged between an area in a first region where the PCB is not arranged and the fixed structure, and is configured to support and protect the PCB in the first region.

In some embodiments, frequencies of sound emit by the vibration of the sound emitting backplane and the OLED display structure are distributed in a low frequency band, a middle frequency band, and a high frequency band.

In some embodiments, the sound emitting backplane includes: a first skin, a second skin, and an intermediate layer. The first skin and the second skin are attached on two sides of the intermediate layer respectively; the intermediate layer includes a plurality of honeycomb cores in a hexagonal arrangement, hexagonal cross sections of the honeycomb cores are arranged perpendicular to the first skin and the second skin, and a stretch ratio of each honeycomb core in a first direction is less than a preset threshold.

In some embodiments, a width of the gap ranges from 1 to 100 mm.

In some embodiments, the present application also provides an OLED SoD panel, including: an OLED display structure, an adhesion structure, a sound emitting backplane, and at least one exciter. A first side of the OLED display structure is configured to display optical signals; a second side of the OLED display structure is attached to a first side of the sound emitting backplane through the adhesion structure; the adhesion structure includes a plurality of double-sided adhesive tapes; the plurality of double-sided adhesive tapes are parallel to a length direction or width direction of an OLED display structure, and are arranged at equal intervals, and a gap is disposed between two adjacent double-sided adhesive tapes; the at least one exciter is attached to a second side of the sound emitting backplane, and the exciter is configured to enable the sound emitting backplane and the OLED display structure to vibrate to emit sound.

In some embodiments, the present application further provides a display apparatus, including: a display structure, a sound emitting backplane, a support structure, a plurality of fixed structures, and at least one exciter. A first side of the display structure is configured to display, and a second side of the display structure is attached to a first side of the sound emitting backplane; a gap is configured between a second side of the sound emitting backplane and the support structure; the plurality of fixed structures are configured to connect the sound emitting backplane to the support structure by the plurality of fixed locations arranged on the second side of the sound emitting backplane; the at least one exciter is attached on the second side of the sound emitting backplane, and the exciter is configured to enable the sound emitting backplane and the OLED display structure to vibrate to emit sound.

In some embodiments, the fixed structures include counterbore seats for mounting and being arranged at fixed locations of the sound emitting backplane, screw rods that are in one-to-one correspondence with the fixed locations, and connectors that are in one-to-one correspondence with the fixed locations and are arranged on the support structure, wherein at the fixed locations, the screw rods pass through the connectors, and then are connected with the counterbore seats.

In some embodiments, the connectors include silicone isolation pads.

In some embodiments, the plurality of fixed locations are arranged on a plurality of preset columns of the sound emitting backplane, wherein at least one fixed location is arranged in each preset column, and a second preset column of the plurality of preset columns is arranged at a midline along a left-right direction of the sound emitting backplane.

In some embodiments, an area of the support structure is less than an area of the sound emitting backplane.

In some embodiments, the display apparatus further includes: a protective frame; wherein the protective frame is arranged at two sides along an up-down direction of the sound emitting backplane and is configured to protect the display structure and the sound emitting backplane.

In some embodiments, a first side of an exciter is attached to the second side of the sound emitting backplane, and a second side of the exciter is attached to a sound emitting structure arranged at a first side of the support structure, wherein the exciter drives the sound emitting structure to vibrate to emit sound from the second side when the exciter drives the sound emitting backplane and the display structure to vibrate to emit sound from the first side.

In some embodiments, the sound emitting structure includes a flat vibration member, a plurality of rubber surrounds, and screws that are in one-to-one correspondence with the rubber surrounds. The support structure is configured with a hollow area around which a plurality of screws are arranged, the flat vibration member is connected with ends of the plurality of rubber surrounds, and the other ends of the plurality of rubber surrounds are connected with the support structure via the plurality of corresponding screws.

In some embodiments, sound emit from the vibration of the sound emitting backplane and the OLED display structure are distributed in a low frequency band, a middle frequency band, and a high frequency band.

In some embodiments, the present disclosure further provides a display apparatus, including: a display structure, a sound emitting substrate, and a plurality of electromagnetic exciters. The display structure is configured to receive and display optical signals. The sound emitting substrate is attached to the display structure, and is divided into a plurality of regions by a plurality of isolation zones, at least some of the regions are attached to at least one of the electromagnetic exciters, the sound emitting substrate includes an intermediate layer, and a first isolation zone of the plurality of isolation zones include a plurality of grooves formed in two side surfaces of the intermediate layer. The plurality of electromagnetic exciters are configured to generate bending waves at an area where the plurality of electromagnetic exciters are attached to the sound emitting substrate, the bending waves are propagated in regions where the electromagnetic exciters are attached to the sound emitting substrate, to enable the regions and a portion of the display structure attached with the regions vibrate to emit sound.

DETAILED DESCRIPTION OF THE EMBODIMENTS

In order to make the objectives, embodiments and advantages of the present application clearer, the exemplary embodiments of the present application will now be described in combination with the drawings of the exemplary embodiments of the present application, and obviously, the exemplary embodiments described are only some, but not all, embodiments of the present application.

The term "remote controller" refers to a component of an electronic device (for example, a display apparatus disclosed in the present application), can wirelessly control the electronic device generally within a short distance range, is generally connected with the electronic device using infrared and/or radio frequency (RF) signals and/or Bluetooth, and may include function modules such as WiFi, wireless USB, Bluetooth and a motion sensor. For example, a handheld touch remote controller uses a user interface on a touch screen to replace most of physical built-in keys in a general remote control device.

Figure 1:
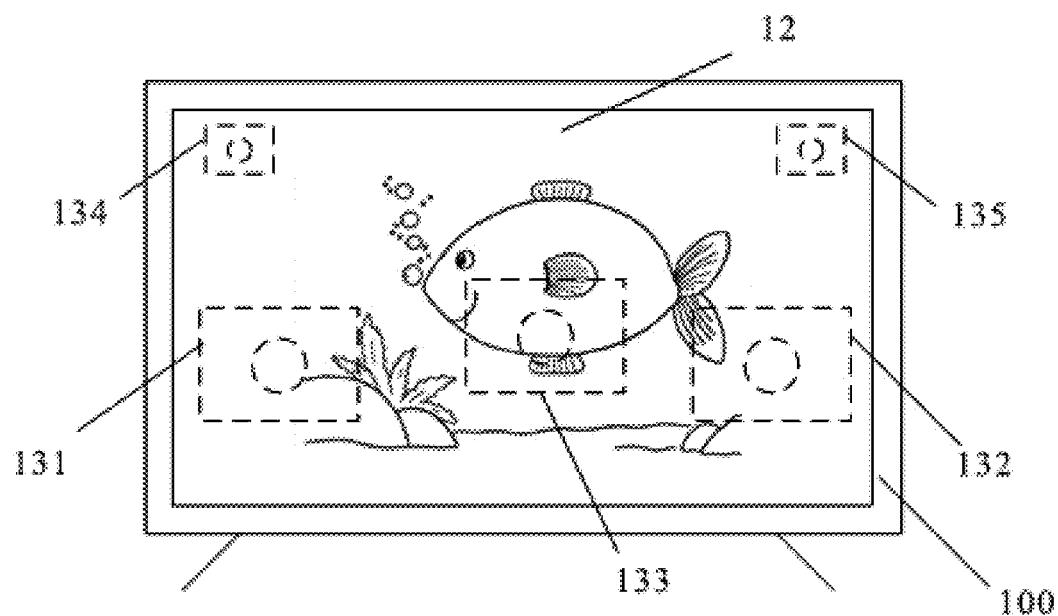
FIG. 1 is a structural schematic diagram illustrating a display apparatus with a speaker.

FIG. 1 is a structural schematic diagram illustrating a display apparatus with a speaker. As shown in FIG. 1, the display apparatus, for example, the television 100 includes: a display 12 and a plurality of speakers 13. The plurality of speakers are arranged behind the display 12 inside the television 100 in a manner that allows the television have Dolby Atmos 2.1.2 or 3.0.2 two-channel height sound effects, for example, a speaker 131 provides a sound signal of a left channel, a speaker 132 provides a sound signal of a right channel, a speaker 133 provides a sound signal of a center channel, a speaker 134 provides a sound signal of a left height channel, and a speaker 135 provides a sound signal of a right height channel Applicant's another Chinese application 201910522902.4 filed on Jun. 17, 2019 describes embodiments of the television with SoD panel technology.

With the development of user's demands for display apparatuses on the market, critical components, such as a display and a base frame, in more and more display apparatuses can be implemented with less thicknesses, and the display apparatus further needs to provide a High-Fidelity (Hi-Fi) sound signal, and to provide four-channel surround, 5.1-channel, 5.1.2-channel, 7.1.2-channel and other Hi-Fi sound signals through more speakers, which requires placement of more speakers within a limited space inside, for example, the television as shown in FIG. 1, and sometimes having to sacrifice the sound effect or increase the thickness of the display apparatus.

Figure 2:
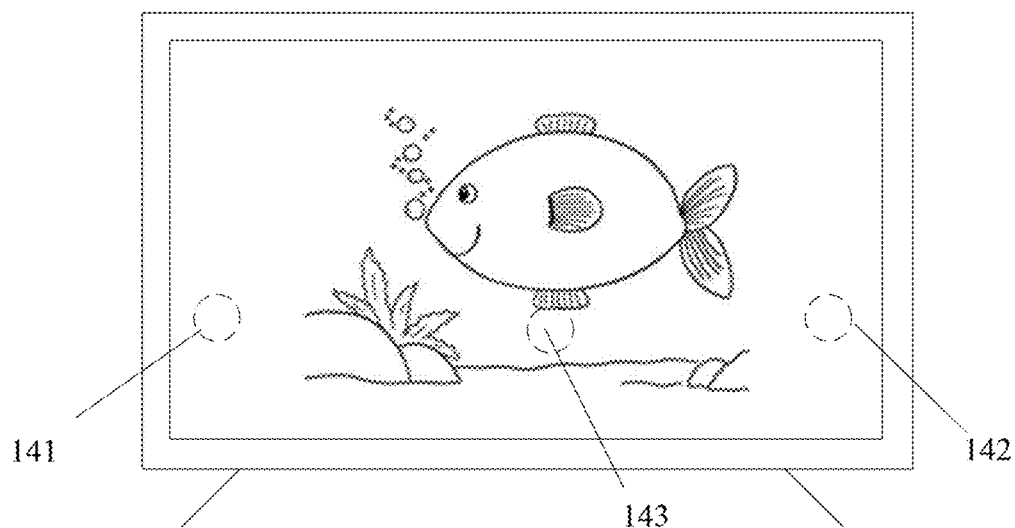
FIG. 2 is a structural schematic diagram illustrating a display apparatus with an electromagnetic exciter.
Figure 3:
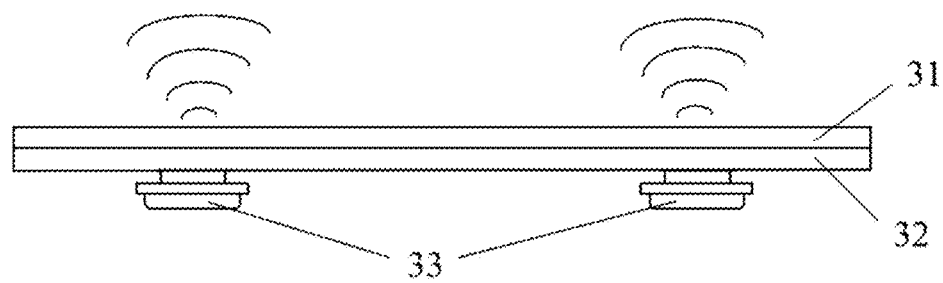
FIG. 3 is a section view of a display apparatus.
Figure 4:
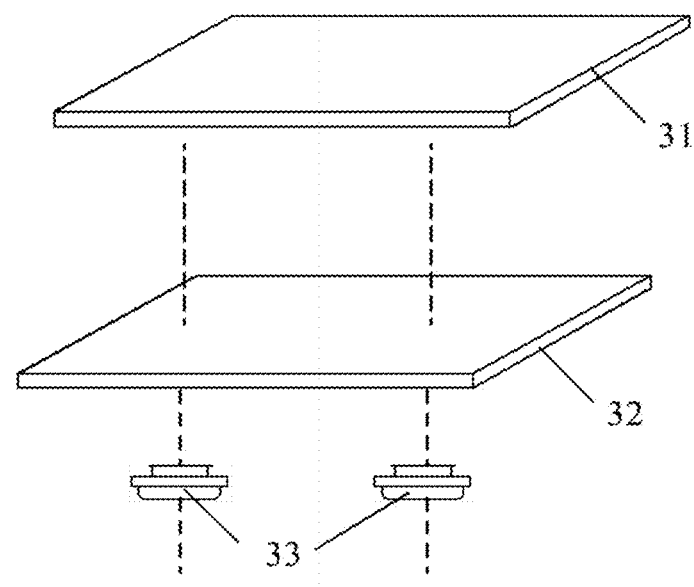
FIG. 4 is an exploded view of a display apparatus.

Therefore, a display apparatus in the related art is configured with a "SoD panel" in order to provide both lightness and sound effect. For example, FIG. 2 is a structural schematic diagram illustrating a display apparatus with electromagnetic exciters, a plurality of electromagnetic exciters that are arranged on a rear side of a display in the display apparatus as shown in FIG. 2 can respectively excite the entire display to emit sound. For example, an electromagnetic exciter 141 provides a sound signal of a left channel, an electromagnetic exciter 142 provides a sound signal of a right channel, and an electromagnetic exciter 143 provides a sound signal of a center channel Since each electromagnetic exciter directly excites the entire display to emit sound, and the overall all directional propagation properties of the display are the same, a sound emitting region of each electromagnetic exciter cannot be subdivided, and the display apparatus can only be configured with three or fewer exciting sound emitting regions generally. For each electromagnetic exciter, as shown in FIG. 3 and FIG. 4, FIG. 3 is a section view of a display apparatus, and FIG. 4 is an exploded view of a display apparatus. The display of the display apparatus includes: a display structure 31 and a sound emitting substrate 32. The display structure 31 may be configured to receive and display video or image in a form of optical signals. The sound emitting substrate 32 emits sound by bending waves emitted via modal resonance under the action of electromagnetic exciters 33. In some embodiment, the sound-emitting substrate is also referred to as sound-emitting backplane. That is, the display structure 31 in the display apparatus can be configured to not only perform display but also emit sound to replace of conventional speakers. Therefore, there is no need to provide mounting locations for the speakers in the display apparatus, and the speakers can be replaced by a corresponding number of electromagnetic exciters 33, thereby allowing the display apparatus to provide stronger sound effects while achieving a lighter and thinner design.

Figure 5:
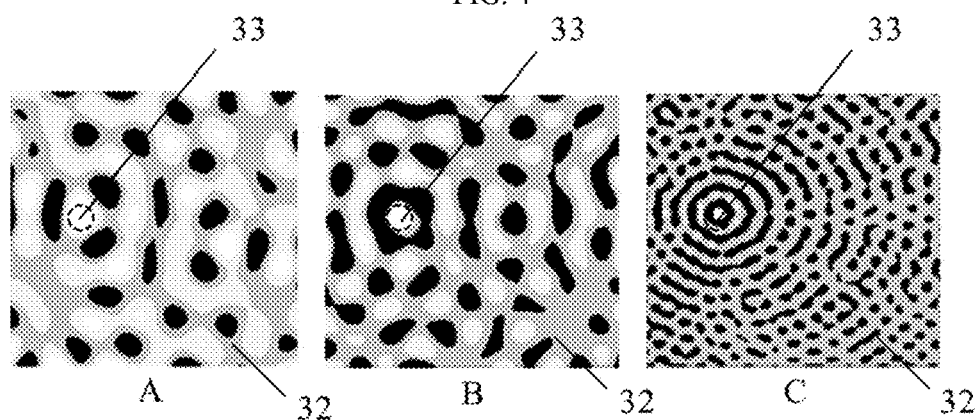
FIG. 5 is a schematic diagram illustrating an amplitude distribution of a bending wave emitting by a display apparatus with an electromagnetic exciter during propagation.

However, in the display apparatus as shown in FIG. 3-FIG. 4, due to the overall arrangement of the sound emitting substrate 32, regardless of how many electromagnetic exciters 33 are arranged at various locations of the sound emitting substrate 32 in the display apparatus, the electromagnetic exciters 33 act on the same sound emitting substrate 32, such that the sound emitting substrate 32 emits sound by bending waves emitted via modal resonance. For example, FIG. 5 is a schematic diagram illustrating an amplitude distribution of bending waves generated by the display apparatus under the action of an electromagnetic exciter during propagation, FIG. 5 shows a schematic diagram of the amplitude of bending waves propagating in the sound emitting substrate 32, wherein the sound emitting substrate 32 emits bending waves under the action of the electromagnetic exciters 33, and the bending waves generated on the sound emitting substrate 32 spread all around centered at a place where the electromagnetic exciters 33 and the sound emitting substrate 32 are attached, and cover the entire sound emitting substrate 32. In the figure, the darker the color on the sound emitting substrate 32 is, the greater the amplitude of the bending wave at that location above a viewing direction is; and the lighter the color on the sound emitting substrate 32 is, the greater the amplitude of the bending wave at that location below the viewing direction is. Meanwhile, in FIG. 5, the frequency of a bending wave A is 200 Hz, the frequency of a bending wave B is 1000 Hz, and the frequency of a bending wave C is 10000 Hz.

As shown in FIG. 5, regardless of the change in frequency of the bending wave, the amplitude of the bending wave in each direction has a little attenuation while the bending wave is spreading in the sound emitting substrate, the amplitude of the bending wave is substantially the same as the amplitude in the vicinity of the electromagnetic exciter 33 even at the rightmost location away from the electromagnetic exciter 33. That is, the bending wave generated by the sound emitting substrate 32 under the action of the electromagnetic exciter 33 is relatively uniform in amplitude distribution at all locations when propagating in the sound emitting substrate 32, resulting in the emission of sound with relatively similar intensity by the sound emitting substrate as a whole. Therefore, when hearing sound emitted by the display apparatus, a user has the intuitive feeling that all locations of the entire panel are emitting similar sound; even though the display apparatus is configured with 5, 7 or more electromagnetic exciters that respectively excite the sound emitting substrate to vibrate, the user cannot clearly distinguish the channel corresponding to which electromagnetic exciter that produces the vibration of the current sound emitting substrate, which in turn results in poor channel distinction when the display apparatus emits sound, affecting the user experience.

Therefore, the embodiments of the present application provide a display apparatus and a SoD panel. The display apparatus is divided into a plurality of regions by isolation zones, at least some of the plurality of regions are attached to electromagnetic exciters, bending waves generated by the electromagnetic exciters in the at least some of the regions are propagated only in a sound emitting substrate in the regions, and different regions of the sound emitting substrate of the display apparatus can be allowed to emit sound separately under the excitation action of electromagnetic exciters in the regions, so that the distinction of channels is improved when the sound emitting substrate emits sound under the action of the electromagnetic exciters corresponding to different channels, the user distinguishes corresponding channels emitted by different electromagnetic exciters, and further, more electromagnetic exciters can be arranged for the display apparatus to transmit sound signals of more channels, thereby improving the user experience of the display apparatus.

Figure 6:
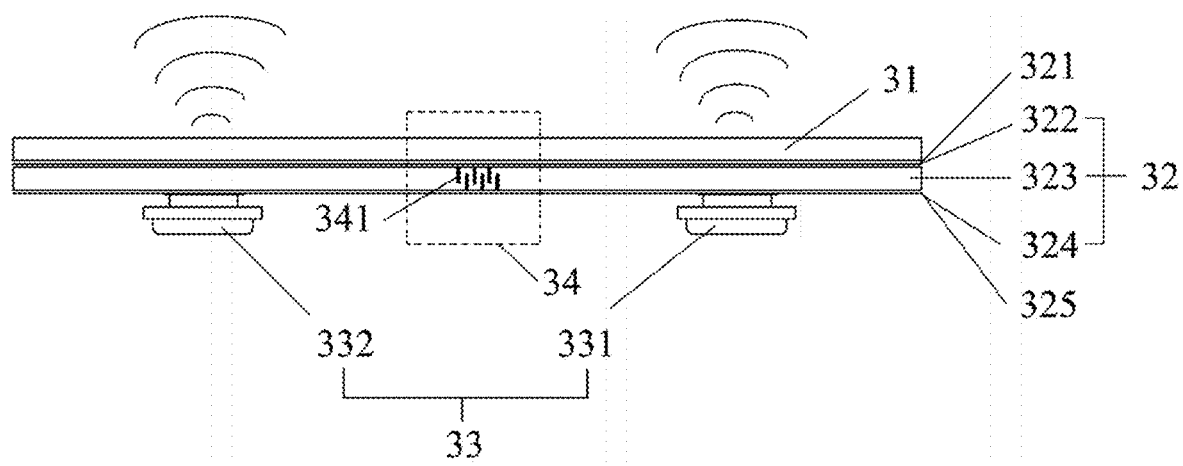
FIG. 6 is a structural schematic diagram illustrating a display apparatus according to an embodiment of the present application.

FIG. 6 is a block diagram illustrating a display apparatus according to an embodiment of the present application. As shown in FIG. 6, the display apparatus includes a display structure 31, a sound emitting substrate 32, and a plurality of electromagnetic exciters 33. The display structure 31 is attached to one side of the sound emitting substrate 32, and the plurality of electromagnetic exciters 33 are attached to the other side of the sound emitting substrate 32. In an example of FIG. 6, two electromagnetic exciters 33 are provided for illustration, where an electromagnetic exciter 332 corresponds to a sound signal of a left channel of the display apparatus, and an electromagnetic exciter 331 corresponds to a sound signal of a right channel of the display apparatus. A surface area of the sound emitting substrate 32 is equal to or less than a surface area of the display structure 31.

In some embodiments, the display structure 31 of the display apparatus is configured to implement a display function of the display apparatus, and configured to receive and display optical signals. The display structure 31 in the embodiments includes a Liquid Crystal Display (LCD), an Organic Light-Emitting Diode (OLED), a laser projection screen or a screen with touch control function, wherein the laser projection screen specifically includes a film having an optical microstructure such as Fresnel, grid, or microlens array. In some embodiments, a rectangle display structure is taken as an example for illustration, for example, the display structure may also be an arc-shaped structure.

In some embodiments, the sound emitting function of the display apparatus may be jointly implemented by any one of the electromagnetic exciters 33 in the display apparatus, the display structure 31 and sound emitting substrate 32. Taking an electromagnetic exciter 331 as an example, the electromagnetic exciter 331 is configured to receive an electrical signal corresponding to sound for play, convert the electrical signal into mechanical vibration, and apply the mechanical vibration to the sound emitting substrate 32. The sound emitting substrate 32 generates a bending wave through modal resonance under the action of the mechanical vibration of the electromagnetic exciter 331, and the bending wave generated on the sound emitting substrate 32 spreads in a 360-degree-direction range centered at a place where the electromagnetic exciter 331 and the sound emitting substrate 32 are attached. The sound emitting substrate 32 and the display structure 31 attached with the sound emitting substrate 32, under the action of the bending wave propagating in the sound emitting substrate 32, vibrate back and forth in an up-down direction in the section view as shown in FIG. 6 to emit sound. In some embodiments, the electromagnetic exciters described in the various embodiments of the present application can also include, but are not limited to, one or more electromagnetic exciters, piezoelectric exciters, magnetostrictive exciters, and any type and structure of exciters used in the future to excite bending waves.

In some embodiments, the sound emitting substrate 32 is further divided into different regions by isolation zones, at least some regions in the plurality of regions are attached to electromagnetic exciters, bending waves generated by the electromagnetic exciters are propagated only inside the regions attached with the electromagnetic exciters, whereas, bending waves propagating through the isolation zones to other regions are attenuated by the isolation zones. That is, the sound emitting substrate 32 of the embodiment can achieve the performance of regional sound emitting, thereby reducing the interaction between the regions during simultaneous sound emitting. It can be understood that in some embodiments, the quantity of the regions divided on the sound emitting substrate 32 may be greater than or equal to the quantity of at least one electromagnetic exciter, for example, the sound emitting substrate 32 is divided into 10 regions, wherein 5 regions are respectively attached to 5 electromagnetic exciters.

Figure 7:
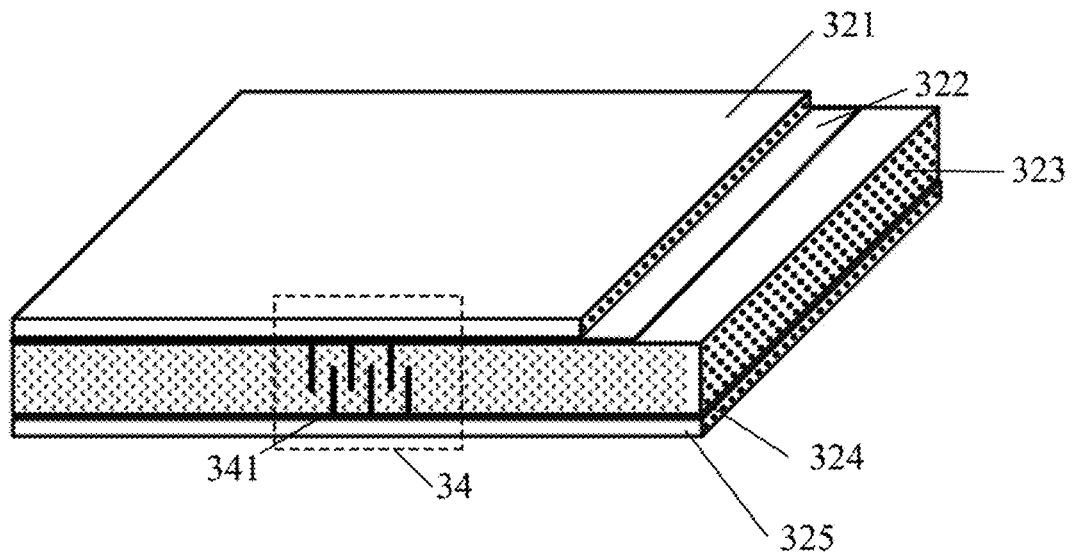
FIG. 7 is a structural schematic diagram illustrating a sound emitting substrate according to an embodiment of the present application.

In some embodiments, FIG. 7 is a structural schematic diagram illustrating a sound emitting substrate according to an embodiment of the present application. As shown in FIG. 6 and FIG. 7, the sound emitting substrate 32 according to the embodiments specifically includes: a first skin 321, a first coating layer 322, an intermediate layer 323, a second coating layer 324, and a second skin 325. The first skin 321 and the second skin 325 are configured to house and fix the intermediate layer 323, and surface areas of the first skin 321, the intermediate layer 323 and the second skin 325 are substantially the same. The first coating layer 322 is attached between the first skin 321 and the intermediate layer 323 and is configured to adhere the first skin 321 and the intermediate layer 323; the second coating layer 324 is attached between the second skin 325 and the intermediate layer 323, and is configured to adhere the second skin 325 and the intermediate layer 323. The first coating layer 322 and the second coating layer 324 may be selected according to the property of the intermediate layer 323, for example, when the intermediate layer 323 is made from a foamed plastic core material, due to multiple holes in material of the intermediate layer 323, the first skin 321 and the second skin 325 may be adhered by the first coating layer 322 and the second coating layer 324; and if the intermediate layer 323 is made from a relatively flat material without holes, the first skin 321 and the second skin 325 may be directly affixed to two surfaces of the intermediate layer 323, respectively.

Figure 8:
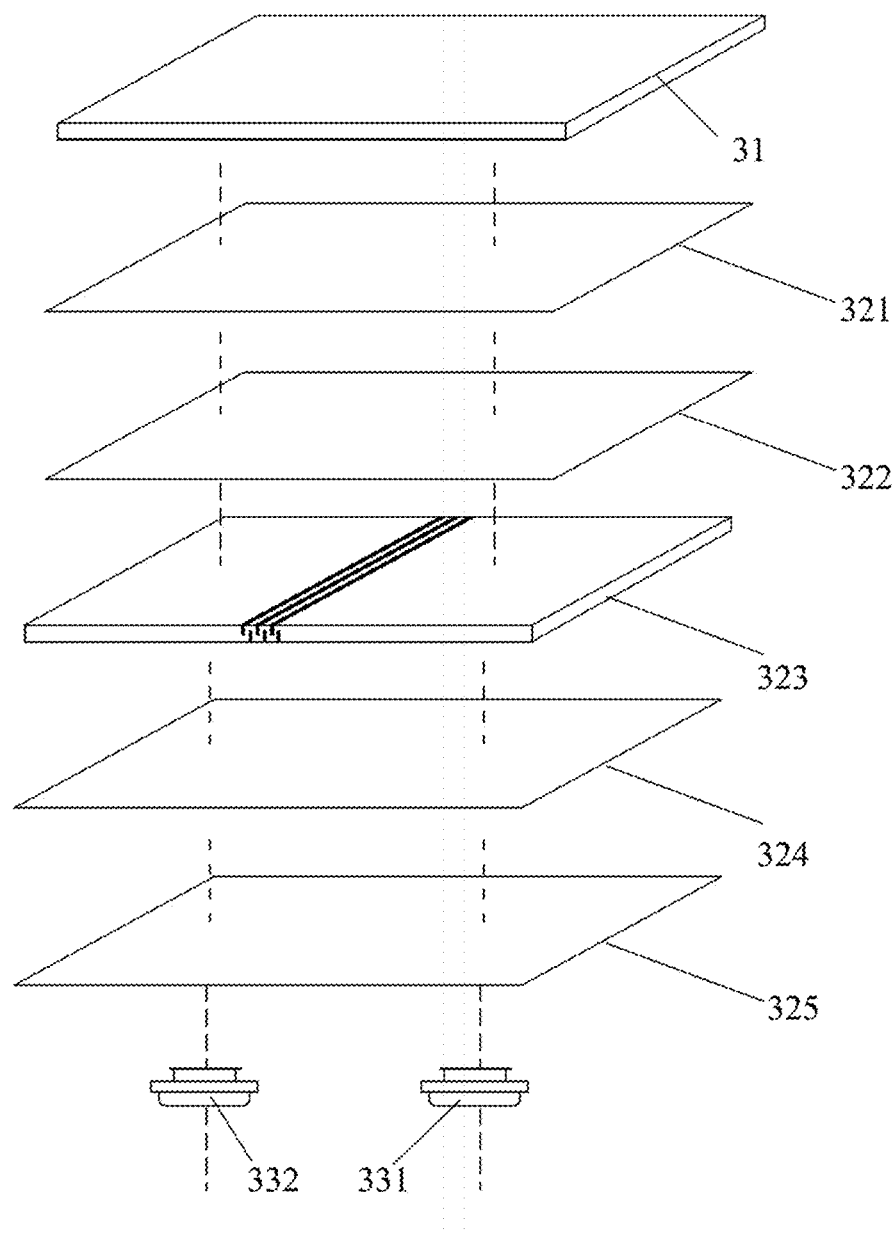
FIG. 8 is an exploded view illustrating a display apparatus according to an embodiment of the present application.

FIG. 8 is an exploded view illustrating a display apparatus according to an embodiment of the present application, wherein the display apparatus employs the sound emitting substrate as shown in FIG. 7, and the sound emitting substrate may be attached to the display structure 31 by one surface of the first skin 321 and attached to a plurality of electromagnetic exciters by one surface of the second skin 325.

In some embodiments, the sound emitting substrate according to the embodiments of the present application is further divided into a plurality of regions by isolation zones, and each region is individually attached to at least one electromagnetic exciter. For example, in an example as shown in FIG. 6 that the display apparatus plays via a left channel and a right channel, the electromagnetic exciter 332 arranged in the display apparatus is configured to emit a sound signal of a left channel, the electromagnetic exciter 331 is configured to emit a sound signal of a right channel, and in this case, the two electromagnetic exciters are both attached to the same side of the sound emitting substrate 32. To distinguish the sound signal emit from the left channel and the sound signal emit from the right channel, the sound emitting substrate 32 may divide the intermediate layer 323 into a left region and a right region by an isolation zone 34, wherein the left region corresponds to the electromagnetic exciter 332, and the right region corresponds to the electromagnetic exciter 331.

Figure 9:
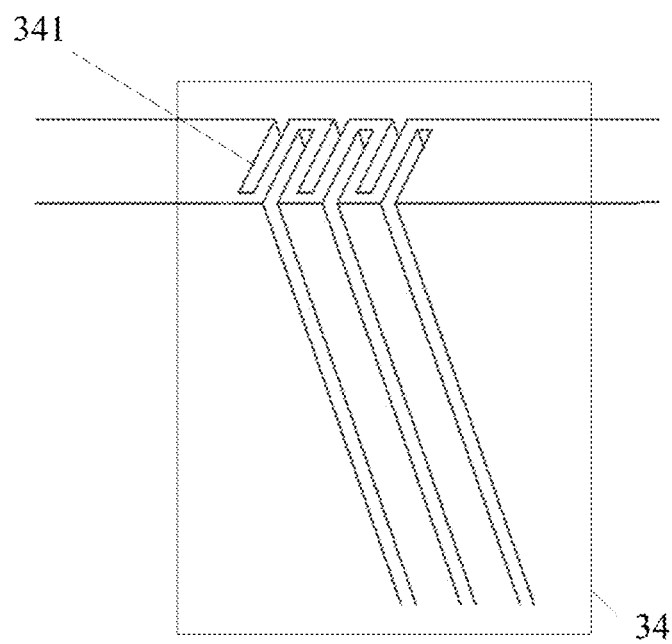
FIG. 9 is a structural schematic diagram illustrating an intermediate layer according to an embodiment of the present application.

In some embodiments, the isolation zone described in the embodiments of the present application includes a plurality of grooves 341 formed in two side surfaces of the intermediate layer 323 of the sound emitting substrate 32, wherein the two side surfaces are specifically configured with at least one groove 341 separately, for example, in the example as shown in FIG. 6, the isolation zone 34 includes three grooves 341 in an upper side of the intermediate layer 323 and three grooves 341 in a lower side of the intermediate layer 323, none of these grooves 341 passes through the intermediate layer 323, a depth of each groove 341 may be greater than or equal to half of a thickness of the sound emitting substrate 32, and in some embodiments, the depth of each groove 341 is 80% of the thickness of the sound emitting substrate. Meanwhile, it can be seen from the exploded view as shown in FIG. 8 that the grooves 341 formed in the two side surfaces of the intermediate layer 323 of the sound emitting substrate are also mutually staggered and are parallel, a depth direction of each groove 341 is perpendicular to the surface of the intermediate layer 323, and an extension direction of each groove 341 is the same as an extension direction of the isolation zone. FIG. 9 is a structural schematic diagram illustrating the intermediate layer according to an embodiment of the present application, wherein the cross-sectional structure of the isolation zone 34 in the intermediate layer for isolating different regions is shown, it can be seen that the staggered grooves 341, formed in the two side surfaces of the intermediate layer, of the isolation zone 34 divide the intermediate layer into left and right portions in the figure, the structure of the intermediate layer itself is not disconnected, and can the play the role of integral support.

Figure 10:
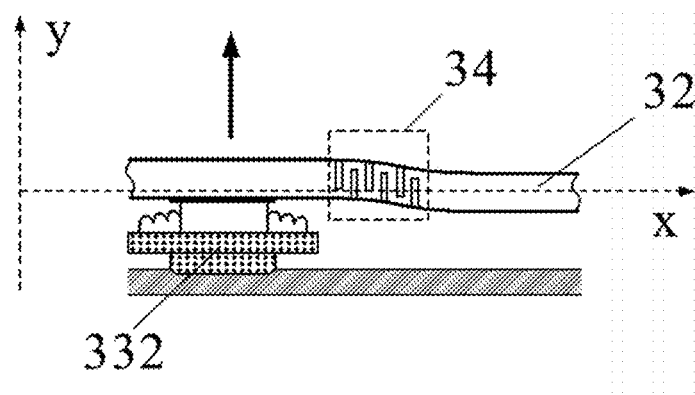
FIG. 10 is a schematic diagram illustrating a state of a sound emitting substrate according to an embodiment of the present application.
Figure 11:
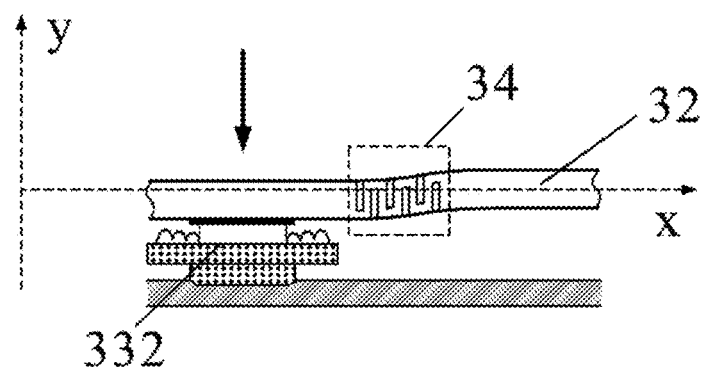
FIG. 11 is a schematic diagram illustrating another state of a sound emitting substrate according to an embodiment of the present application.

Accordingly, in the display apparatus as shown in FIG. 6, since the sound emitting substrate 32 has the isolation zone 34 in the intermediate layer 323, such that the sound emitting substrate 32 is divided into the left and right portions. Taking the electromagnetic exciter 332 corresponding to the sound signal from the left channel as an example, FIG. 10 is a schematic diagram illustrating a state of the sound emitting substrate according to an embodiment of the present application. It can be seen that when the electromagnetic exciter 332 imposes an upward force to the sound emitting substrate 32 in a process that the electromagnetic exciter 332 drives the sound emitting substrate 32 to vibrate by mechanical vibration, a region, which is located on a left side of the isolation zone 34, of the sound emitting substrate 32 deforms upwards under the force. At the same time, due to the presence of the isolation zone 34, the isolation zone 34 is lower in rigidity, and has a strength anisotropic mechanical conduction property, which shows that the strength in a direction perpendicular to the extension direction of each groove is less than the strength in a parallel direction of each groove, such that the isolation zone 34 as a whole may play the role of damping and attenuating the propagation of vibrations on two sides, even if the region on the left side of the isolation zone 34 deforms upwards, the isolation zone 34 also does not propagate the upward deformation to a region on a right side, the region on the right remains in a state of no deformation or a state of extremely slight deformation in this case, so as to form a gradient difference of a corresponding excitation distribution of the bending waves between the regions on the left and right sides, such that it is easier for a user to distinguish sounds emit by the regions on the left and right sides. In contrast, FIG. 11 is a schematic diagram illustrating another state of the sound emitting substrate according to an embodiment of the present application, which shows that when the electromagnetic exciter 332 imposes a downward force to the sound emitting substrate 32, the region, which is located on the left of the isolation zone 34, of the sound emitting substrate 32 may deform downwards, and the region on the right side remains in a state of no deformation or a state of extremely slight deformation, so as to form a gradient difference of a corresponding excitation distribution of the bending waves between the regions on the left and right sides, such that it is easier for a user to distinguish sounds produced by the regions on the left and right sides.

Figure 12:
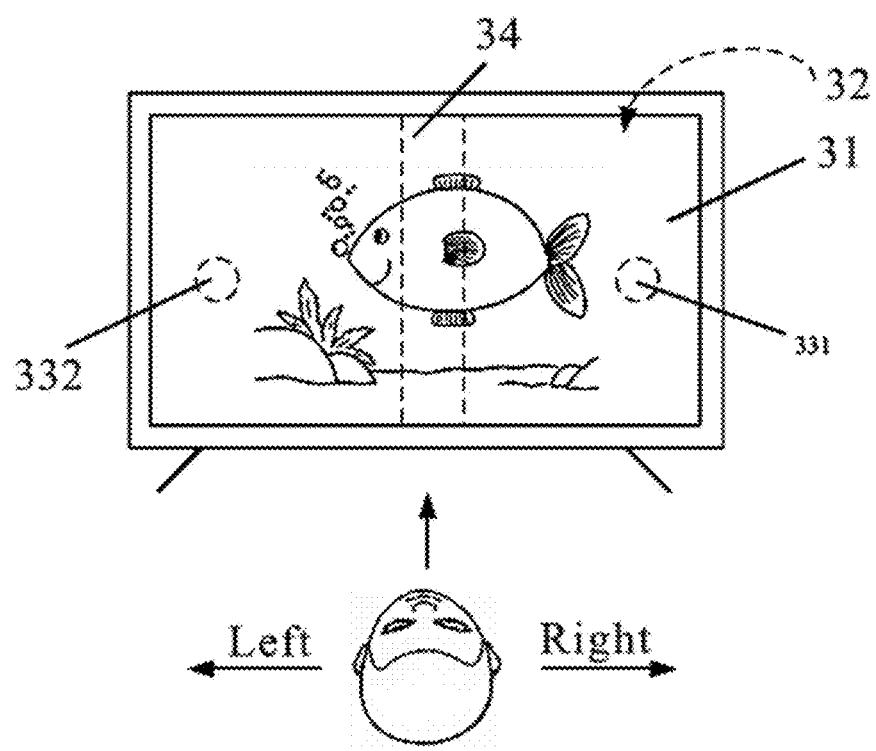
FIG. 12 is a schematic diagram illustrating an application scenario for a display apparatus according to an embodiment of the present application.

FIG. 12 is a schematic diagram illustrating an application scenario for the display apparatus according to an embodiment of the present application. When the electromagnetic exciter 332 corresponding to the left channel of the display apparatus drives, by way of mechanical vibrations, the sound emitting substrate 32 and the display structure 31 to cyclically repeat the states of FIGS. 10-11 so as to move up and down to produce a bending wave, due to the presence of the isolation zone 34, the region, which is located on the left side of the isolation zone 34, of the sound emitting substrate 32 and the display structure 31 vibrates to emit sound, the region located on the right side of the isolation zone may not emit significant sound, and the user can clearly hear sound from the left side of the display but cannot hear sound from the right side of the display generally at the moment, so that the sound of the left channel corresponding to the electromagnetic exciter 332 can be more clearly distinguished. Likewise, when the electromagnetic exciter 331 corresponding to the right channel of the display apparatus drives the sound emitting substrate 32 and the display structure 31 to move up and down so as to generate a bending wave to emit sound, the region, which is located on the right side of the isolation zone 34, of the sound emitting substrate 32 and the display structure 31 vibrates to emit sound, the region located on the left side of the isolation zone may not emit significant sound, and the user can clearly hear sound from the right side of the display but cannot hear sound from the left side of the display generally at the moment, so that the sound of the right channel corresponding to the electromagnetic exciter 331 can be more clearly distinguished.

The sound emitting substrate is divided into a plurality of regions by the isolation zones, at least some regions are attached to the electromagnetic exciters, the bending waves generated by the electromagnetic exciters are only propagated inside the regions attached with the electromagnetic exciters, such that when the bending waves generated by the electromagnetic exciters are propagated in different regions of the sound emitting substrate of the display apparatus, the isolation zones locally change the isotropic mechanical conduction property of the original homogeneous sound emitting substrate, local anisotropy is produced at divisions of the grooves, regional control is applied to the vibration propagation range of the bending waves, the propagation of the vibrating bending waves outside the regions are attenuated, modal vibration is controlled within the required range, and thus the bending waves are only propagated inside the regions, without affecting other regions. Therefore, the distinction of the channels in the display apparatus is improved when the display apparatus emits sound under the action of the electromagnetic exciters corresponding to the different regions, such that the user distinguishes the channels corresponding to the sounds from different electromagnetic exciters, and further, more electromagnetic exciters can be arranged for the display apparatus to transmit sound signals from more channels, thereby overcoming the deficiency of implementation of more channel sound signals due to low sound distinction caused by unrestricted spreading of the bending waves excited by the electromagnetic exciters across on the entire panel in the existing display apparatus as shown in FIG. 2. Exemplarily, the display apparatus, by the arrangement of more electromagnetic exciters, may realize sound signals corresponding to a plurality of channels, for example, 2.0 channels (for representing 2 left and right channels), 2.1 channels (for representing left and right channels, and 1 subwoofer channel), 3.0 channels (for representing left, right, and center channels), 3.1 channel (for representing left, right, and center channels, and 1 subwoofer channel), or Dolby Atmos 2.1.2 channels with left and right height channels, thereby improving user's experience of the display apparatus. In addition, the present application provides the isolation zones for dividing the sound emitting substrate into different regions, which is achieved by the grooves formed in the two side surfaces of the sound emitting substrate. The grooves are simple in structure, and are easy to fabricate, thereby facilitating the promotion and application of the structure. Meanwhile, thanks to high design flexibility, the direction and distribution of the grooves can be flexibly set and adjusted according to different regions divided on different sound emitting substrates.

In some embodiments, to facilitate the arrangement of the isolation zone in the intermediate layer of the sound emitting substrate, the intermediate layer of the sound emitting substrate provided in the embodiments of the present application may be made of a foamed plastic core material. For example, the foamed plastic core material may be polymethacrylamide (PMI), hard polystyrene, or other rigid foamed plastic.

In some embodiments, the materials of the first skin and the second skin include, but are not limited to, fiberglass, carbon fiber, hybrid glass-carbon fiber, plastic, lightweight aluminum, or the like. In some embodiments, the thicknesses of the first skin and the second skin may be the same or different. In some embodiments, the thicknesses of the first skin and the second skin range from 0.1 mm to 0.7 mm; or, in some embodiments, the thicknesses of the first skin and the second skin range from 0.12 mm to 0.2 mm.

In the embodiment as shown in FIG. 7, taking the sound emitting substrate 32 including the first skin 321, the first coating layer 322, the intermediate layer 323, the second coating layer 324 and the second skin 325 as an example, in other embodiments, if the material properties of the display structure 31 are suitable, the display structure 31 may directly serve as the first skin 321 in the sound emitting substrate 32, and is attached to one side surface of the sound emitting substrate 32, that is, the display structure 31 may be directly connected with the intermediate layer 323 by the first coating layer 322, thereby simplifying the structure of the display apparatus. In this case, the display structure 31 which serves as the first skin may specifically be a display film having an optical microstructure, such as a Fresnel projection optical film.

In some embodiments, the description is made in an example that the display apparatus is configured with two electromagnetic exciters, and the sound emitting substrate of the display apparatus is divided into two regions that are in one-to-one correspondence to the electromagnetic exciters respectively, it should be understood that more than one electromagnetic exciter may be attached to each region of the display apparatus, and the electromagnetic exciters inside the region work together to make the region vibrate to emit sound; and moreover, a plurality of regions may also be set according to the effects of different sound signals.

Figure 13:
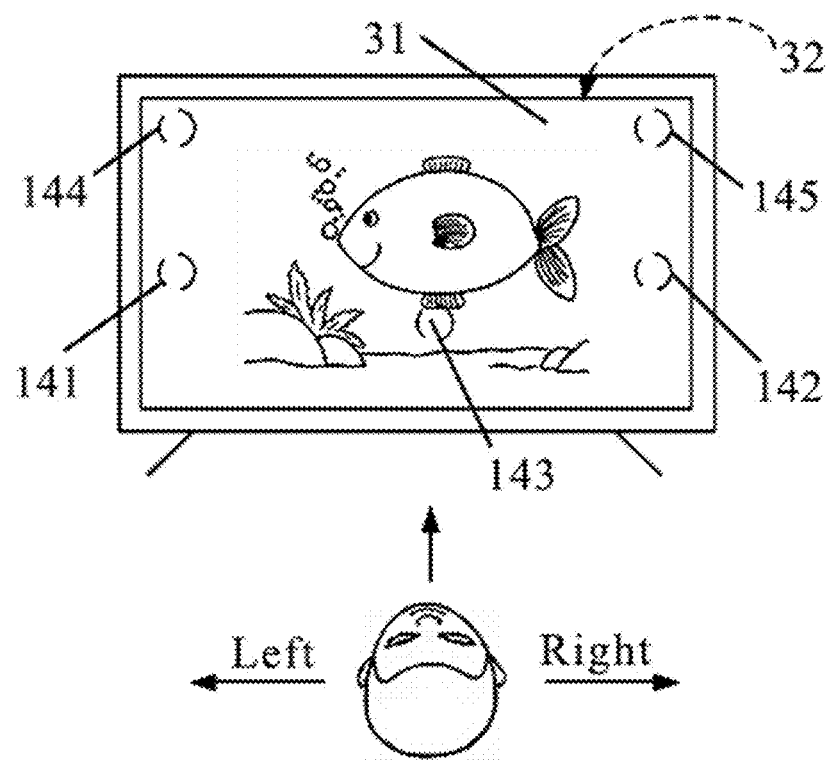
FIG. 13 is a schematic diagram illustrating an application scenario for a display apparatus according to another embodiment of the present application.

FIG. 13 is a schematic diagram illustrating the display apparatus according to another embodiment of the present application. In the display apparatus as shown in FIG. 13, 5 electromagnetic exciters are configured in a Dolby Atmos 3.0.2 or 2.1.2 height sound effect mode, wherein an electromagnetic exciter 141 is arranged behind the left side of the display apparatus, and is configured to provide a sound signal of a front left (FL) channel; an electromagnetic exciter 142 is arranged behind the right side of the display apparatus, and is configured to provide a sound signal of a front right (FR) channel; an electromagnetic exciter 143 is arranged behind the middle of the display apparatus, and is configured to provide a sound signal of a front center channel; an electromagnetic exciter 144 is arranged behind the front top left side of the display apparatus, and is configured to provide a sound signal of a front top left (FTL) channel; and an electromagnetic exciter 145 is arranged behind the front top right side of the display apparatus, and is configured to provide a sound signal of a front top right (FTR) channel, and the sound signal of the FTL channel and the sound signal of the FTR channel may also be referred to as height sound signals. Thus, the sound emitting substrate in the display apparatus as shown in FIG. 13 needs to be divided into at least 5 regions that are respectively corresponding to the above 5 electromagnetic exciters.

Figure 14:
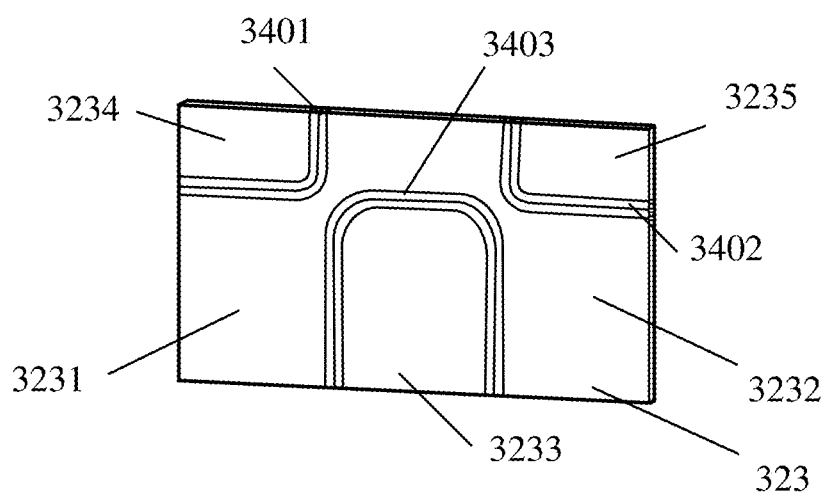
FIG. 14 is a structural schematic diagram illustrating an isolation zone of a sound emitting substrate according to an embodiment of the present application.
Figure 15:
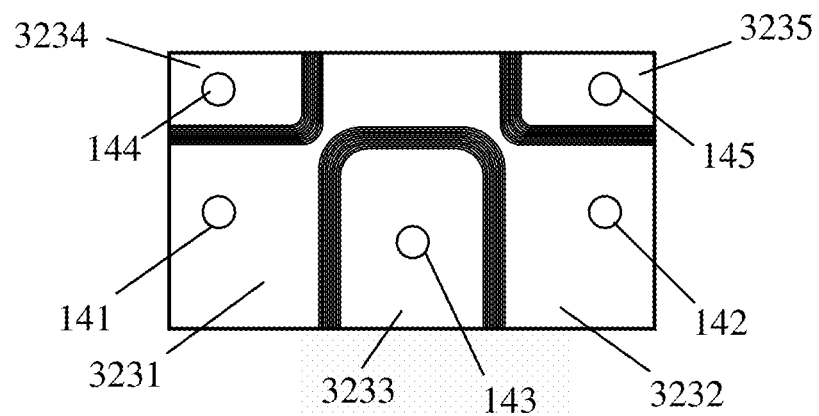
FIG. 15 is a structural schematic diagram illustrating regions divided on a sound emitting substrate according to an embodiment of the present application.

FIG. 14 is a structural schematic diagram illustrating the isolation zones of the sound emitting substrate according to an embodiment of the present application. As shown in FIG. 14, three isolation zones 3401, 3402 and 3403 are arranged for the intermediate layer 323 of the sound emitting substrate, and divide the intermediate layer 323 of the sound emitting substrate into at least five regions: a region 3231 located at a left portion of the display apparatus, a region 3232 located at a right portion of the display apparatus, a region 3233 located at a middle portion of the display apparatus, a region 3234 located at a top left portion of the display apparatus, and a region 3235 located at a top right portion of the display apparatus. In some embodiments, FIG. 15 is a structural schematic diagram illustrating regions divided on the sound emitting substrate according to an embodiment of the present application. After the three isolation zones are divided as shown in FIG. 14, the electromagnetic exciter 141 can drive the sound emitting substrate corresponding to the region 3231 to vibrate to emit sound, the electromagnetic exciter 142 can drive the sound emitting substrate corresponding to the region 3232 to vibrate to emit sound, the electromagnetic exciter 143 can drive the sound emitting substrate corresponding to the region 3233 to vibrate to emit sound, the electromagnetic exciter 144 can drive the sound emitting substrate corresponding to the region 3234 to vibrate to emit sound, and the electromagnetic exciter 145 can drive the sound emitting substrate corresponding to the region 3235 to vibrate to emit sound.

Figure 16:
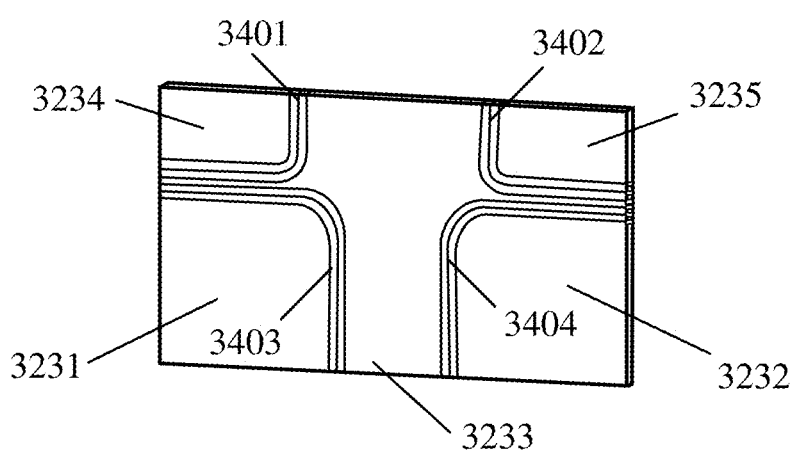
FIG. 16 is a structural schematic diagram illustrating an isolation zone of a sound emitting substrate according to another embodiment of the present application.
Figure 17:
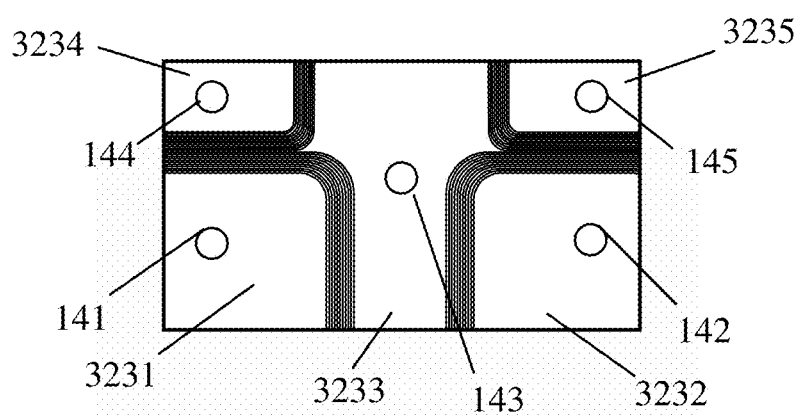
FIG. 17 is a structural schematic diagram illustrating regions divided on a sound emitting substrate according to another embodiment of the present application.

Alternatively, FIG. 16 is a structural schematic diagram illustrating the isolation zones of the sound emitting substrate according to an embodiment of the present application. As shown in FIG. 16, four isolation zones 3401, 3402, 3403 and 3404 are arranged for the intermediate layer 323 of the sound emitting substrate, and similarly divide the intermediate layer 323 of the sound emitting substrate into five regions. FIG. 17 is a structural schematic diagram illustrating regions divided on the sound emitting substrate according to another embodiment of the present application. After the four isolation zones are divided as shown in FIG. 16, the electromagnetic exciter 141 can drive the sound emitting substrate corresponding to the region 3231 to vibrate to emit sound, the electromagnetic exciter 142 can drive the sound emitting substrate corresponding to the region 3232 to vibrate to emit sound, the electromagnetic exciter 143 can drive the sound emitting substrate corresponding to the region 3233 to vibrate to emit sound, the electromagnetic exciter 144 can drive the sound emitting substrate corresponding to the region 3234 to vibrate to emit sound, and the electromagnetic exciter 145 can drive the sound emitting substrate corresponding to the region 3235 to vibrate to emit sound.

According to the display apparatus in the embodiments of the present application, the sound emitting substrate of the display apparatus is divided into a plurality of regions by the isolation zones, the bending wave generated by the electromagnetic exciter inside each region is only propagated in the sound emitting substrate in the region, and especially in view of the height sound effect of the display apparatus, the effects and varieties of the sound signals provided by the display apparatus can be enriched, for example, a greater variety of stereo sound is achieved, thereby improving the user experience. More electromagnetic exciters require more regions divided on the sound emitting substrate, the isolation zones can be realized by simple groove design, and further, the design complexity and time and labor costs required for the design can be reduced.

Figure 18:
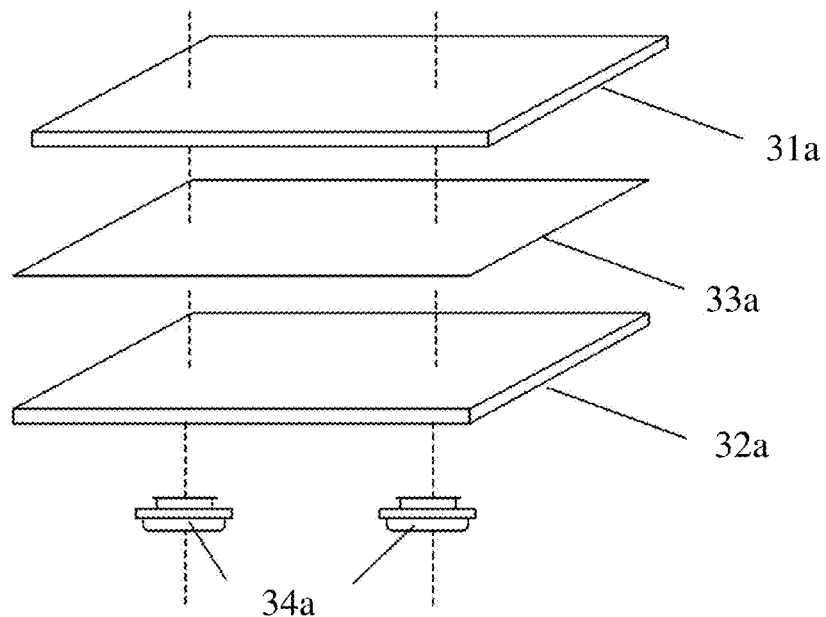
FIG. 18 is a structural schematic diagram illustrating a display apparatus according to an embodiment of the present application.

In some embodiments, FIG. 18 is a structural schematic diagram illustrating the display apparatus according to an embodiment of the present application. As shown in FIG. 18, the display apparatus may be an OLED display apparatus configured with an OLED SoD panel, the display apparatus includes an OLED display structure 31a, a sound emitting backplane 32a, an adhesion structure 33a, and at least one exciter 34a. A first side of the OLED display structure 31a is configured to display optical signals, a second side of the OLED display structure 31a is attached to a first side of the sound emitting backplane 32a by the adhesion structure 33a, and the at least one exciter 34a is attached to a second side of the sound emitting backplane 32a. A surface area of the sound emitting backplane 32a is equal to or less than that of the OLED display structure 31a.

As shown in FIG. 18, the OLED display structure 31a, the sound emitting backplane 32a and the at least one exciter 34a of the display apparatus are jointly used to implement the sound emitting function of the display apparatus. In FIG. 18, taking the at least one exciter 34a specifically including two exciters as an example, any one of the exciters 34a may be configured to receive an electrical signal corresponding to sound for play, and convert the electrical signal into mechanical vibration that is then applied to the sound emitting backplane 32a. The sound emitting backplane 32a generates bending waves through modal resonance under the action of the mechanical vibration of the exciter 34a, the bending waves generated on the sound emitting backplane 32a spread in a 360-degree-direction range centered at a place where the exciter 34a and the sound emitting backplane 32a are attached. The sound emitting backplane 32a and the OLED display structure 31a attached with the sound emitting substrate 32, under the action of the bending waves propagating in the sound emitting backplane 32a, vibrate back and forth in an up-down direction shown in FIG. 18 to emit sound.

Figure 19:
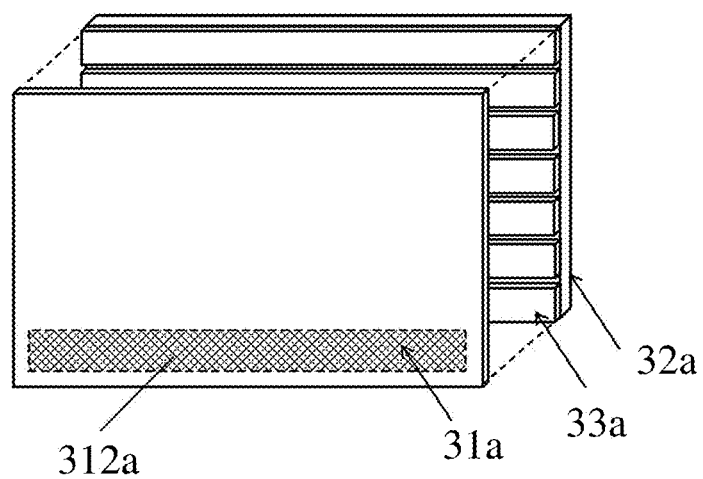
FIG. 19 is a detailed structural schematic diagram illustrating an adhesion structure according to an embodiment of the present application.

In some embodiments, due to the limited frequency range of the OLED display structure 31a when the OLED display structure 31a vibrates alone to emit sound, in order to arrange the sound emitting backplane 32a, the adhesion structure 33a is required to be arranged between the OLED display structure 31a and the sound emitting backplane 32a, and is configured to fix and propagate the vibration. FIG. 19 is a detailed structural schematic diagram illustrating an adhesion structure in the present application, and FIG. 19 shows an embodiment of an adhesion structure 33a. The adhesion structure 33a is implemented by a plurality of double-sided adhesive tapes, and the plurality of double-sided adhesive tapes are parallel to a length or width direction of the display apparatus, for example, in FIG. 19, the plurality of double-sided adhesive tapes are arranged parallel to a lower side edge of the display apparatus (equivalently, parallel to a lower side edge of the OLED display structure or the sound emitting backplane), so that the adhesion structure 33a can transmit the vibration between the OLED display structure 31a and the sound emitting backplane 32a. Meanwhile, the plurality of double-sided adhesive tapes are arranged at equal intervals, and a gap is present between two adjacent double-sided adhesive tapes, and each reserved gap may serve as a slit for air venting through a left-right direction between the OLED display structure 31a and the sound emitting backplane 32a. A width of each gap may be set between 1-100 mm, in some embodiments, may be configured to be 2-4 mm to facilitate venting air from front and back adhesion surfaces of the adhesion structure 33a and improving the adhesion quality when the OLED display structure 31a and the sound emitting backplane 32a are attached.

Accordingly, according to the OLED display apparatus in some embodiments, the second side of the OLED display structure is connected with the sound emitting backplane by the adhesion structure, and the issue that the frequency of sound produced by vibration is only distributed in a high frequency band when the OLED display structure serves as a SoD panel, is overcome. By propagating and driving the vibration of the OLED display structure through the sound emitting backplane, the frequency of sound produced by the OLED display apparatus can be distributed in a low frequency band, a middle frequency band, and the high frequency band, so that devices such as a speaker/subwoofer does not need to be arranged inside the display apparatus to compensate and modify the sound emit by an OLED display panel, the overall complexity of the display apparatus configured with the sound-emitting OLED display panel is reduced, more sounds in the low frequency band may be emit by the OLED display structure by the attached sound emitting backplane in the case of no additional speaker hardware, and further, the OLED display can balance a more realistic sound field and a thinner and lighter style.

Figure 20:
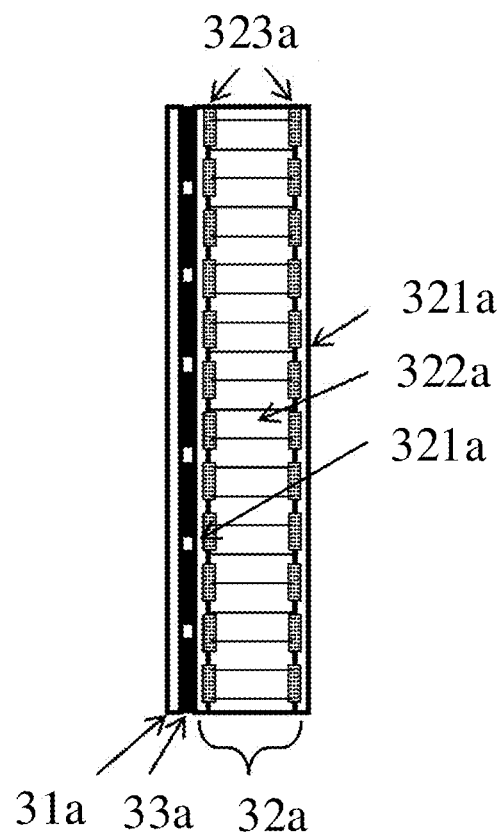
FIG. 20 is a structural schematic diagram illustrating a sound emitting backplane according to an embodiment of the present application.

In some embodiments, in a specific embodiment where the sound emitting backplane is provided, the sound emitting backplane 32a specifically includes: an intermediate layer 322a and skins 321a arranged on two sides of the intermediate layer 322a. For example, as shown in FIG. 20 that is a structural schematic diagram illustrating the sound emitting backplane according to an embodiment of the present application, skins 321a are respectively arranged on a first side and a second side of the intermediate layer 322a, surface areas of the two skins 321a are substantially the same as a surface area of the intermediate layer 322a, or the two skins 321a may cover at least a portion of the intermediate layer 322a.

Figure 21:
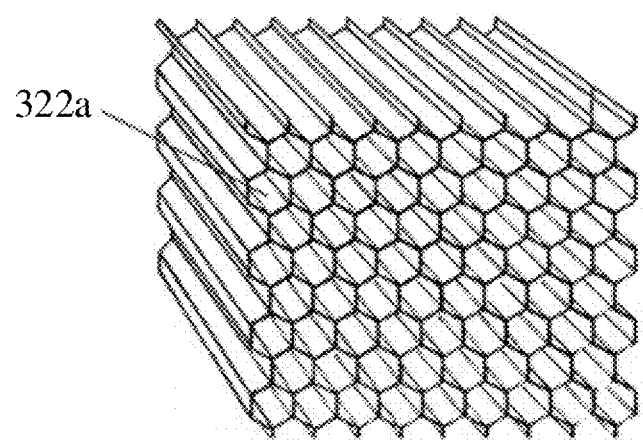
FIG. 21 is a structural schematic diagram illustrating an intermediate layer according to an embodiment of the present application.
Figure 22:
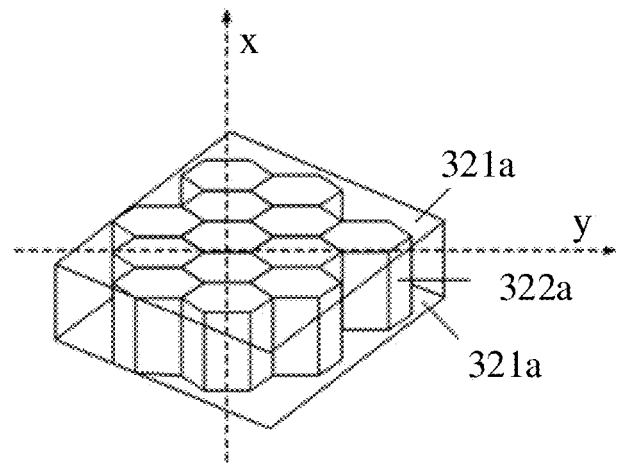
FIG. 22 is a structural schematic diagram illustrating an adhesion structure of an intermediate layer and a skin of a sound emitting backplane according to an embodiment of the present application.

In some embodiments, FIG. 21 is a structural schematic diagram illustrating the intermediate layer according to an embodiment of the present application. The intermediate layer 322a of the sound emitting backplane 32a in some embodiments is formed by connection of a plurality of hexagonal honeycomb cores, and except for the honeycomb cores around the structure, side surfaces of the six edges of a honeycomb core are respectively connected with side surfaces of other honeycomb cores. In some embodiments, FIG. 22 is a structural schematic diagram illustrating an adhesion structure of the intermediate layer and the skin of the sound emitting backplane in the present application. As shown in FIG. 22, a honeycomb core in the intermediate layer 322a has a cross section arranged perpendicular to the skin 321a. In some embodiments, the intermediate layer including the honeycomb cores is parallel to a y direction by arranging two parallel edges of hexagonal honeycomb core walls, wherein the hexagonal honeycomb core walls do not have parallel edges in an x direction, such that the sound emitting backplane has different propagation properties in the x direction and y direction. Specifically, different propagation properties in different directions are realized by adjusting a stretch ratio of the hexagonal cross section of the honeycomb core.

Figure 23:
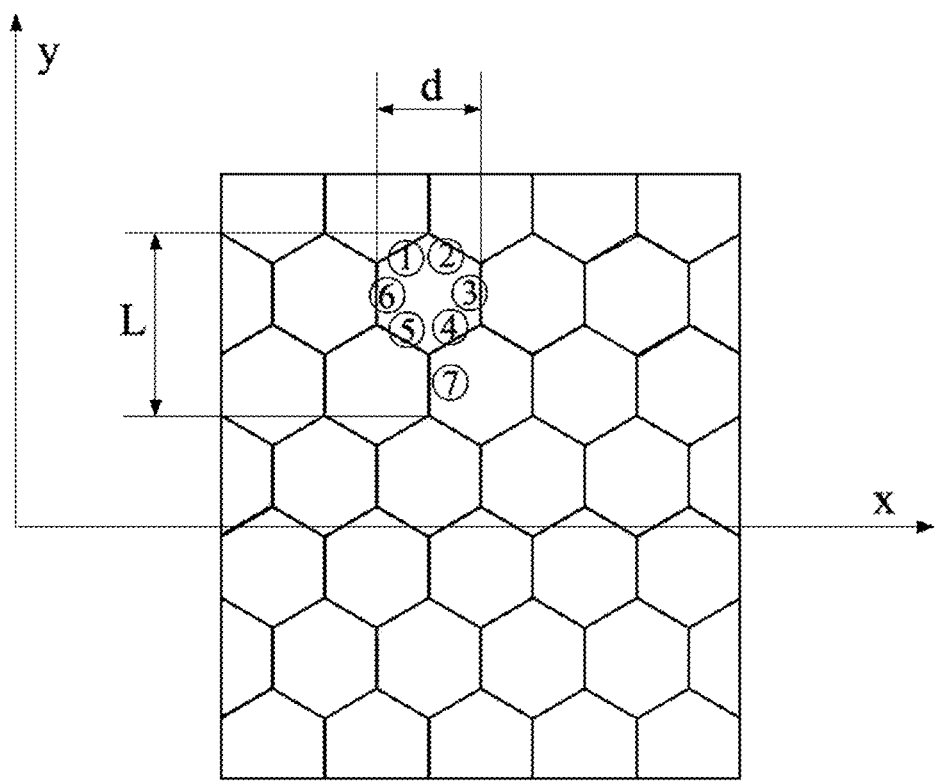
FIG. 23 is a section view of an intermediate layer of a sound emitting backplane according to an embodiment of the present application.

In some embodiments, FIG. 23 is a section view of the intermediate layer of the sound emitting backplane according to an embodiment of the present application. As shown in FIG. 23, the hexagonal cross section of the honeycomb core has a stretch ratio d/L in the x-y directions. A first direction is denoted as the y direction in the figure and a second direction is denoted as the x direction in the figure; d is a unit length of each honeycomb core in the x direction when a plurality of hexagonal honeycomb cores are arranged in sequence, wherein the unit length d refers to the smallest length unit of the plurality of hexagonal honeycomb cores in the x direction after the plurality of hexagonal honeycomb cores are arranged in sequence, i.e., the plurality of hexagonal honeycomb cores are repeatedly arranged in the x direction according to the unit length d; in FIG. 23, the unit length d is a distance d between an edge ③ and an edge ⑥ of the hexagon perpendicular to the x direction; L is a unit length of each honeycomb core in the y direction when the plurality of hexagonal honeycomb cores are arranged in sequence, the unit length L refers to the smallest length unit of the plurality of hexagonal honeycomb cores in the y direction after the plurality of hexagonal honeycomb cores are arranged in sequence, i.e., the plurality of hexagonal honeycomb cores are repeatedly arranged according to the unit length L; in FIG. 23, the unit length L is a sum of distances of the edges ①, ⑥, ⑤, and ⑦ of the hexagon in the y direction. The stretch ratio in the x direction is 0.58:1 for a standard hexagon. In some embodiments, in order to make the sound emitting backplane have different propagation properties in different directions, the honeycomb cores in the intermediate layer of the sound emitting backplane may be all stretched in the x direction of the hexagonal cross section at a preset stretch ratio, such that the stretch ratio of the hexagonal interface of each honeycomb core is less than a preset threshold (0.58:1). The smaller stretch ratio d/L indicates a denser distribution of parallel walls the hexagonal interfaces of the honeycomb cores in the y direction as shown in FIG. 23, and stronger rigidity, and thus bending waves are propagated by vibration easily; included angles of the hexagonal honeycomb core walls in the x direction are larger, the rigidity is weaker, and thus, it is easy to absorb the propagation of vibration of the bending waves.

Accordingly, due to the configuration of the stretch ratio of the honeycomb cores as shown in FIG. 23, different propagation properties of the sound emitting backplane in the x direction and y direction are realized, and further, amplitude attenuation laws of the bending waves in the x direction and y direction are different when the sound emitting backplane propagates the bending waves. In some embodiments, as shown in FIG. 23, when the stretch ratio in the y direction is less than 0.58:1, the sound emitting backplane has weaker propagation properties in the x direction for the bending waves than its propagation properties in the y direction, resulting in that a magnitude of amplitude attenuation of the bending waves in the x direction is greater than a magnitude of amplitude attenuation of the bending waves in the y direction when the sound emitting backplane configured with the intermediate layer as shown in FIG. 23 transmit the bending waves.

Figure 24:
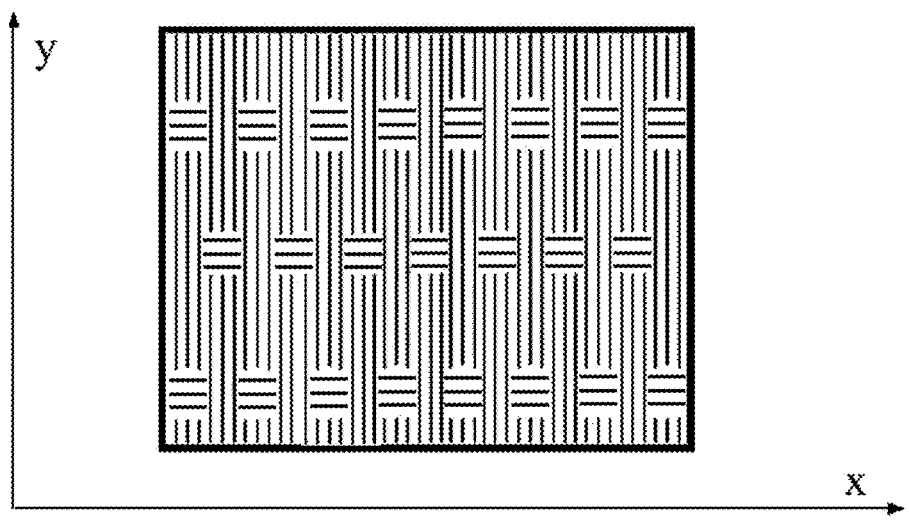
FIG. 24 is a structural schematic diagram illustrating a skin of a sound emitting backplane according to an embodiment of the present application.

The skins are attached to the two sides of the intermediate layer, so that in order to fit the propagation properties of the intermediate layer in the x-y directions, fibers of the skins in the intermediate layer in some embodiments are also set accordingly. For example, FIG. 24 is a structural schematic diagram illustrating a skin of the sound emitting backplane in the present application, in a structural schematic diagram of surface fibers of the skin as shown FIG. 24, a structure of the skin is an interwoven fiber structure in the x-y directions, wherein the density of fibers parallel to the y direction and perpendicular to the x direction is greater than the density of fibers parallel to the x direction and perpendicular to the y direction. Alternatively, in another skin structure in some embodiments, fibers parallel to the x direction and perpendicular to the y direction may not be arranged, i.e., the skin is a unidirectional fiber structure with all fibers parallel to the y direction and perpendicular to the x direction.

Accordingly, the structure of the skin as shown in FIG. 24 can cooperate with the propagation of the intermediate layer, such that the amplitude attenuation laws of the bending waves in the x direction and y direction are different when the sound emitting backplane propagates the bending waves. In some embodiments, in the embodiment as shown in FIG. 24, the fibers of the skin have a denser parallel fiber distribution in the y direction, and are stronger in rigidity, so that the bending waves are easier to propagate by vibration; whereas the fibers of the skin have a sparser parallel fiber distribution in the x direction, and are weaker in rigidity, so that the bending waves cannot be propagated by vibration easily. Thus, when the sound emitting backplane configured with the intermediate layer as shown in FIG. 23, and the skin as shown in FIG. 24 propagates the bending waves, the magnitude of amplitude attenuation of the bending waves in the x direction is greater than the magnitude of amplitude attenuation of the bending waves in the y direction.

In some embodiments, the honeycomb cores in the above embodiments may be made of paper, aramid fiber, metal, or other composite materials. In some embodiments, the material of the skin includes, but is not limited to, fiberglass, carbon fiber, hybrid glass-carbon fiber, plastic, lightweight aluminum, or the like. In some embodiments, the thicknesses of the first skin and the second skin may be the same or different. In some embodiments, the thicknesses of the skin range from 0.1 mm to 0.5 mm; or, the thicknesses of the skin range from 0.1 mm to 0.18 mm.

Figure 25:
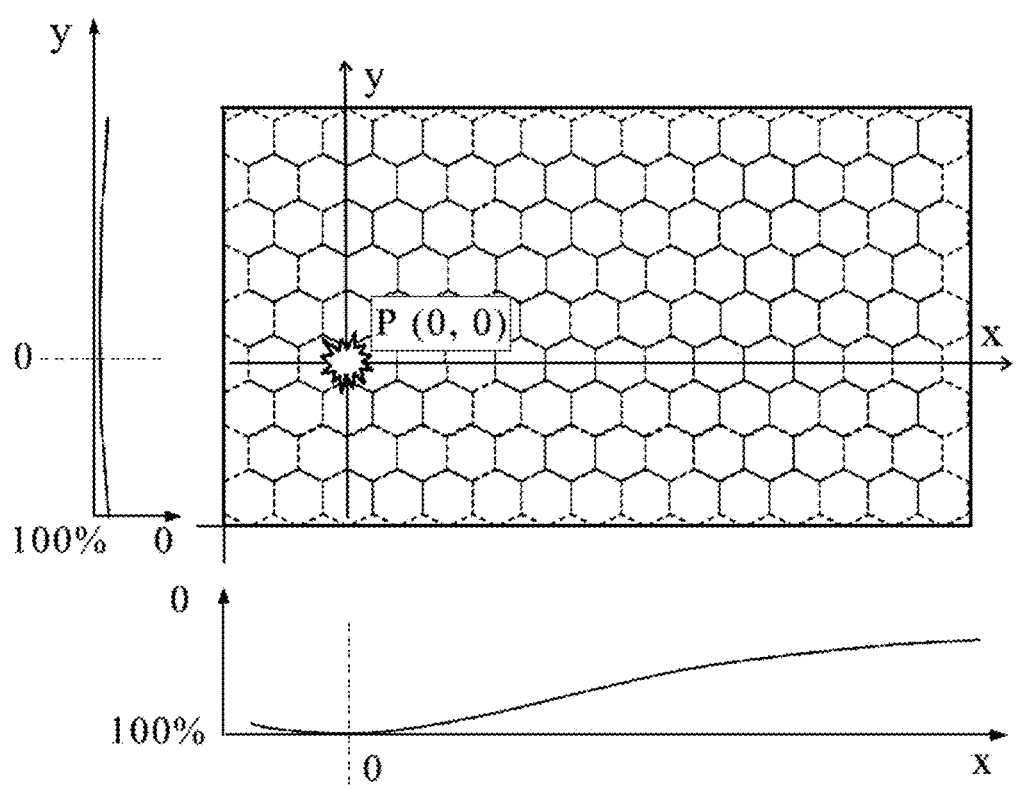
FIG. 25 is a schematic diagram illustrating an amplitude attenuation law when a display apparatus propagates bending waves according to an embodiment of the present application.

In some embodiments, FIG. 25 is a schematic diagram illustrating an amplitude attenuation law when the display apparatus propagates bending waves according to an embodiment of the present application, and in FIG. 25, the magnitudes of amplitude attenuation in various directions under excitation of the exciters are shown in FIG. 25. In the x-y directions, a point P (0, 0) in which x=0, y=0 in the figure is denoted as a location where the exciter 34a is attached to the sound emitting backplane 32a, then the bending waves generated by the sound emitting backplane 32a under the action of the electromagnetic exciter 34a spread around centered at the point P, and the sound emitting substrate has the greatest amplitude at the point P. The amplitude at the point P at a certain moment is denoted as 100%*D, when the bending waves spread in 360-degree range centered at the point P in the sound emitting backplane 32a, the amplitude gradually attenuates from 100%*D to 90%*D, 80%*D Especially when the bending waves are propagated in the x direction and y direction separately, the amplitude at the point P has a greater amplitude attenuation value and attenuation speed in the x direction than an amplitude attenuation value and attenuation speed of the amplitude at the point P in the y direction since the stretch ratio of each honeycomb core of the intermediate layer is less than the preset threshold and the fiber density of the skin in the y direction is greater than the fiber density of the skin in the x direction.

Figure 26:
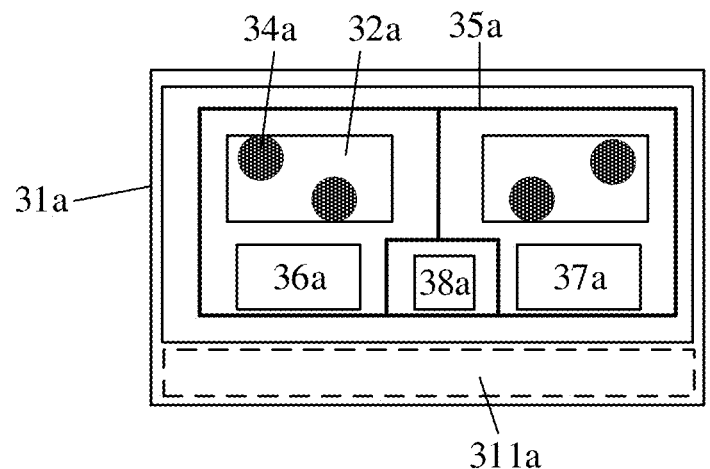
FIG. 26 is a structural schematic diagram illustrating a display apparatus according to an embodiment of the present application.

In some embodiments, FIG. 26 is a structural schematic diagram illustrating the display apparatus according to an embodiment of the present application. The display apparatus as shown in FIG. 26 based on any of the above embodiments further includes: a fixed structure 35a configured to support and fix the OLED display structure 31a and the sound emitting backplane 32a so as to provide support protection for the overall structure formed by attaching the OLED display structure 31a to the sound emitting backplane 32a. In a specific implementation, the display apparatus as shown in FIG. 26 may be a television, the fixed structure 35a may also be referred to as a middle frame backplane of the television, and a rear housing of the television may house the fixed structure 35a. The fixed structure 35a may be enclosed by a thin wall structure with protruding reinforcement skeletons and a middle reinforcement beam, and holes for screw mounting a television stand may also be arranged behind the fixed structure 35a.

In some embodiments, in an example as shown in FIG. 26, two exciters 34a are arranged on each of the left side and right side of the display apparatus, the two exciters 34a on the left side and the two exciters on the right side in FIG. 26 are configured to provide sound signals of the right and left channels, respectively. The respective embodiments of the present application do not limit the specific quantity of the exciters arranged in the display apparatus. In addition, a hollow portion of the fixed structure 35a of the display apparatus may be further configured with a main board 37a, a power board 36a, a TCON board 38a, or the like of the display apparatus.

Figure 27:
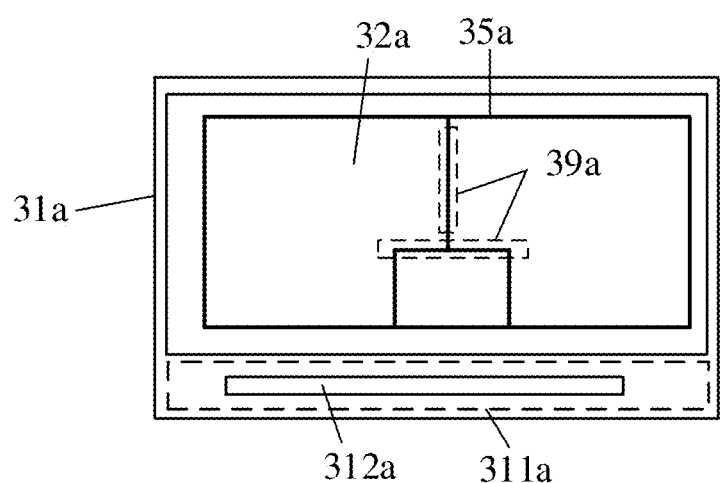
FIG. 27 is a structural schematic diagram illustrating a buffer structure according to an embodiment of the present application.

In some embodiments, the sound emitting backplane 32a in the display apparatus is connected with the fixed structure by a buffer structure. FIG. 27 is a structural schematic diagram illustrating a buffer structure according to an embodiment of the present application, as shown in FIG. 27, the fixed structure 35a in some embodiments is not attached to the sound emitting backplane 32a, but is in a non-contact state in which the fixed structure 35a is kept away from the sound emitting backplane 32a by a certain distance, and is connected with the sound emitting backplane 32a by providing buffer structures 39a at gaps between the edges and a reinforced longitudinal beam in the fixed structure 35a. The material of each buffer structure may be a damping double-sided adhesive, and surfaces, facing the fixed structure 35a, of the buffer structures 39a are located on the same plane, so as to facilitate the parallel adhesive connection with the fixed structure 35a.

Figure 28:
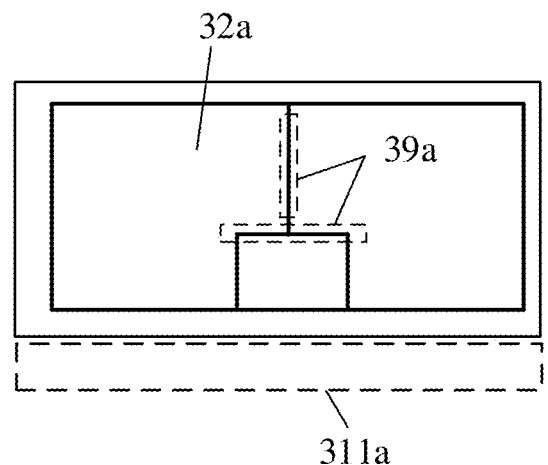
FIG. 28 is a structural schematic diagram illustrating a buffer structure according to another embodiment of the present application.

Meanwhile, since the area of the sound emitting backplane 32a of the display apparatus is smaller than the area of the OLED display structure 31a, in the example as shown in FIG. 27, a portion of region of the OLED display structure 31a partially protrudes from the sound emitting backplane 32a, and this portion of region is denoted with dashed lines and is denoted as a first region 311a. Moreover, the OLED display structure 31a is configured with a printed circuit board 312a (PCB) on the first region 311a. As can be seen, if the fixed structure 35a is affixed behind the sound emitting backplane 32a, a certain space is formed between the OLED display structure 31a and the fixed structure 35a in the first region, the space is located just at one side edge (typically the lower edge) of the display apparatus, and once a hand of a user holds the first region when the user moves the display apparatus, the pressing force may likely damage the OLED display structure 31a due to the space between the OLED display structure 31a and the fixed structure 35a. Therefore, FIG. 28 is a structural schematic diagram illustrating a buffer structure according to another embodiment of the present application. As shown in FIG. 28, the display apparatus in the embodiment of the present application further provides a partial buffer structure at a location where the PCB 312a is not arranged in the first region 311a, and the hardness of the partial buffer structure arranged in the first region 311a is greater than the hardness of the buffer structure arranged outside the first region 311a.

Figure 29:
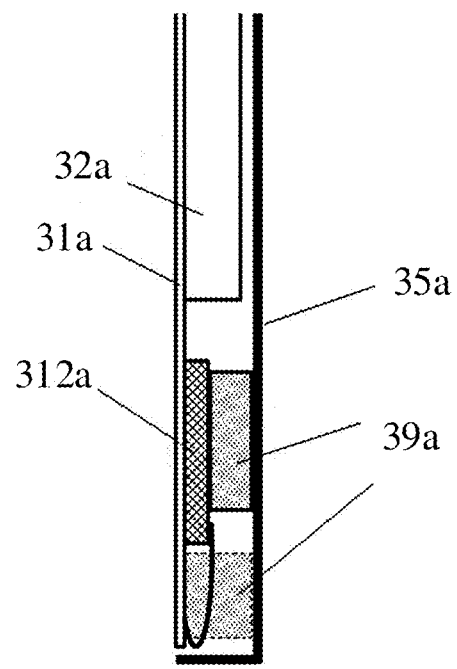
FIG. 29 is a structural schematic diagram illustrating a buffer structure according to yet another embodiment of the present application.

FIG. 29 is a structural schematic diagram illustrating a buffer structure according to yet another embodiment of the present application. As can be seen from an interface shown in FIG. 29, the buffer structure 39a is arranged in the first region between the OLED display structure 31a and the fixed structure 35a, and can protect the PCB 312a in the first region, so that even if a user or a person holds the upper side of the first region, the pressing force may be evenly dispersed to the whole OLED display structure 31a by the buffer structure 39a arranged between the OLED display structure 31a and the fixed structure 35a, thereby avoiding causing fracture or other damages to the OLED display structure 31a and the PCB 312a thereon when the first region is pressed, guaranteeing the safety performance of the whole display apparatus, prolonging the service life of the display apparatus, and further improving user's experience.

Figure 30:
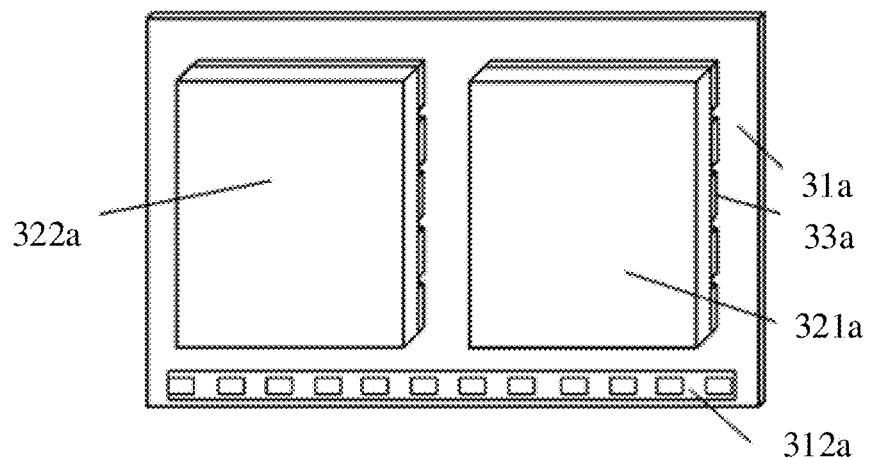
FIG. 30 is a structural schematic diagram illustrating a sound emitting backplane according to another embodiment of the present application.
Figure 33:
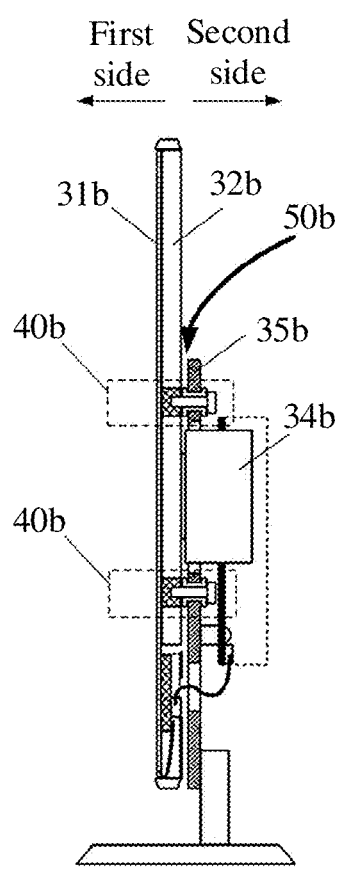
FIG. 33 is a structural schematic diagram illustrating a display apparatus according to an embodiment of the present application.

In some embodiments, based on that the first region 311a is included at the lower side of the OLED display structure 31a, the sound emitting backplane 32a may be a whole and cover the entire OLED display structure 31a (the first region 311a at the lower side and the PCB 312a arranged in the first region are included, and the structure after the coverage may refer to FIG. 33). Alternatively, FIG. 30 is a structural schematic diagram illustrating a sound emitting backplane according to another embodiment of the present application, wherein an area of the sound emitting backplane 32a may also be less than that of the OLED display structure 31a, and a plurality of sound emitting backplanes may be arranged according to the sound emitting needs of the display apparatus. For example, in FIG. 30, two sound emitting backplanes 321a and 322a arranged at the left and right sides of the display apparatus are taken as example, each of the two sound emitting backplanes 321a and 322a is connected with an exciter, and the sound emitting backplanes 32a and 322a may provide sound signals of the left and right channels respectively.

Figure 31:
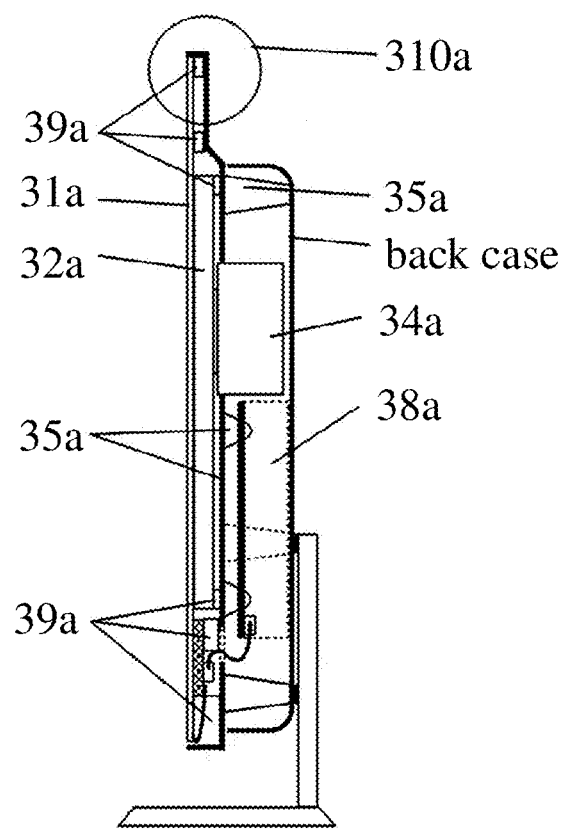
FIG. 31 is a structural schematic diagram illustrating a display apparatus according to an embodiment of the present application.

In some embodiments, FIG. 31 is a structural schematic diagram illustrating a display apparatus according to an embodiment of the present application, which shows a cross-sectional structure of the display apparatus with the sound emitting backplane 32a as shown in FIG. 30, wherein since the area of the sound emitting backplane 32a is smaller than that of the OLED display structure 31a, the OLED display structure 31a is not covered by the sound emitting backplane 32 in a region 310 above the display structure, and thus the OLED display panel 31 is directly connected with the backplane of the display apparatus which may be implemented by adhesion of the double-sided adhesive tapes.

Figure 32:
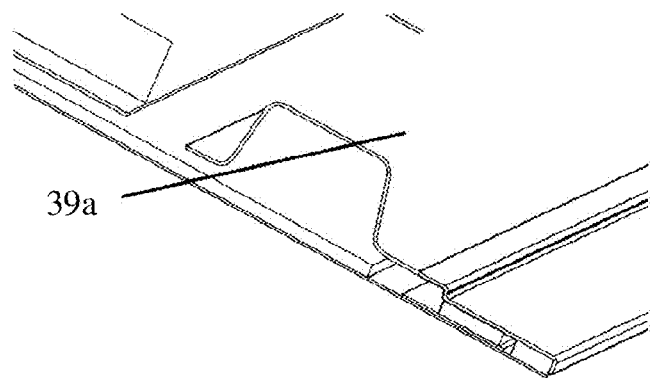
FIG. 32 is a specific enlarged view of a cross section of a buffer structure according to an embodiment of the present application.

In some embodiments, FIG. 32 is a specific enlarged view of a cross section of the buffer structure according to an embodiment of the present application. As shown in FIG. 32, the buffer structure 39a may be a buffering adhesive tape in a gate-like structure in the figure, and may likewise provide support protection in the space within the first region between the OLED display structure 31a and the fixed structure 35a.

FIG. 33 is a structural schematic diagram illustrating a display apparatus according to an embodiment of the present application, and a SoD panel of the display apparatus as shown in FIG. 33 may be implemented by an OLED display. The display apparatus includes a display structure 31b, a sound emitting backplane 32b, a support structure 35b, a plurality of fixed structures 40b, and at least one exciter 34b.

A first side of the display structure 31b is configured to display optical signals, and a second side of the display structure 31b is attached to a first side of the sound emitting backplane 32b. The at least one exciter 34b is attached to a second side of the sound emitting backplane 32b.

In some embodiments, the display structure 31b, the sound emitting backplane 32b, and the at least one exciter 34b are jointly configured to achieve the sound emitting function of the display apparatus. Each exciter 34b may be used separately to drive the display structure 31b and the sound emitting backplane 32b. In FIG. 33, taking an exciter 34b as an example, the exciter may be configured to receive an electrical signal corresponding to sound for play and convert the electrical signal into mechanical vibration that is then directly applied to the sound emitting backplane 32b. The display structure 31b, together with the sound emitting backplane 32b, vibrates back and forth in a direction between first side and second side in the figure under the action of the mechanical vibration of the exciter 34b to generate bending waves that spread around in a 360-degree-direction range centered at a place where the exciter 34b and the sound emitting backplane 32b are attached, thereby emitting sound.

In some embodiments, in order to prevent the support structure 35b from interfering with the movements of the display apparatus 31b and the sound emitting backplane 32b in the first and second side directions, in the display apparatus in some embodiments, the support structure 35b is not in direct contact with the second side of the sound emitting backplane 32b, but a gap 50b is formed between the support structure 35b and the second side of the sound emitting backplane 32b. Meanwhile, a plurality of fixed structures 40b may be configured to use a plurality of location points at the second side of the sound emitting backplane 32b as fixed locations, the sound emitting backplane 32b is connected with the support structure 35b by the several fixed locations. The fixed structures 40b specifically may be flexible floating fixed structures, such that the support structure 35b and the sound emitting backplane 32b, which are connected by the fixed structures 40b, may be not in direct contact while keeping connection, and may have slight flexible deformation at the relative location after being connected, thereby reducing the influence of the support structure 35b on vibration of the sound emitting backplane 32b, achieving the effect that the sound emitting backplane 32b "floats" on the support structure 35b, and finally maintaining the free movement of the sound emitting backplane 32b within an amplitude while supporting the sound emitting backplane 32b.

Figure 34:
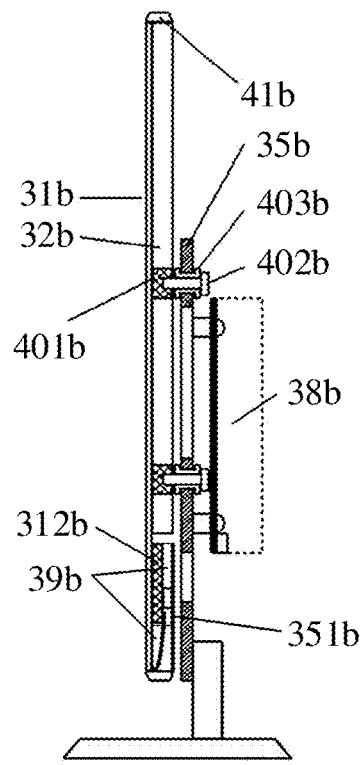
FIG. 34 is a structural schematic diagram illustrating a display apparatus according to an embodiment of the present application.

FIG. 34 is a structural schematic diagram illustrating a display apparatus according to an embodiment of the present application, wherein a specific structure of the fixed structure 40b is described in FIG. 34. As shown in FIG. 34, the fixed structure 40b at any one of the fixed locations includes a counterbore seat 401b for mounting arranged at the second side of the sound emitting backplane 32b, a screw rod 402b corresponding to a mounting location, and a connector 403b that is on the support structure 35b and is corresponding to the mounting location. If the exposed surface of the counterbore seat 401b is flush with the surface of the sound emitting backplane 32b, for the upper fixed structure 40b in FIG. 34, the counterbore seat 401b arranged on the sound emitting backplane 32b is matched with the screw rod 402b in shape and a hollow location of the connector 403b arranged on the support structure 35b is also matched with the threaded rod 402b in shape. The screw rob 402b may pass through the connector 403b to connect and fix to the counterbore seat 401b, and the mounting of one end of the screw rod 402b and the sound emitting backplane 32b is achieved. Meanwhile, the screw rod 402b may also be flexibly connected with the support structure 35b by the connector 403b, so that floating mounting of the relative location between the sound emitting backplane 32b and the support structure 35b is achieved by an acting force provided by the screw rod 402b, and a gap 50b is present between the support structure 35b and the sound emitting backplane 32b.

Figure 35:
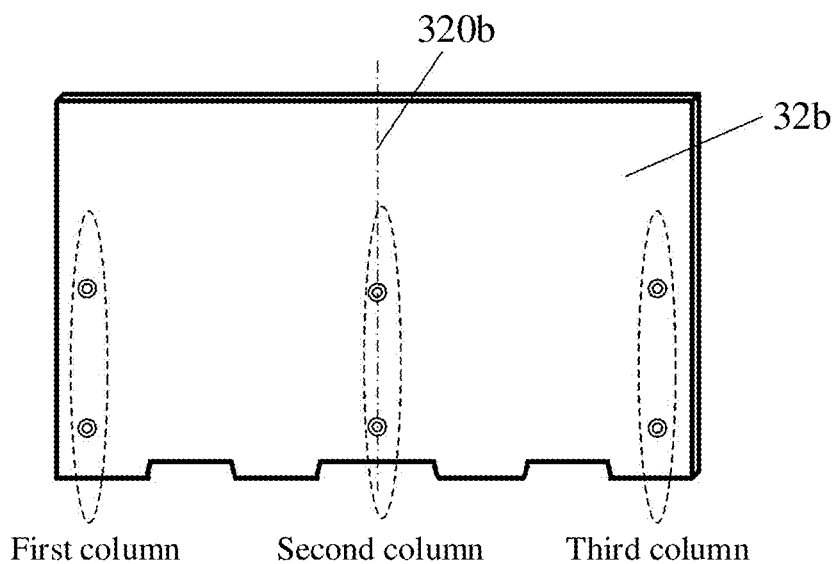
FIG. 35 is a schematic diagram illustrating a location of a fixed structure according to an embodiment of the present application.

In some embodiments, the connector 403b may be a silicone isolation pad, or, the connector 403b may also be I-shaped, such that the I-shaped connector, while satisfying the mounting requirement for the I-shaped structure, may enable a flexible connection by the silicone material and provide a certain deformation, minimizing the influence of the mounting structure on the vibration of the sound emitting backplane 32b when the sound emitting backplane 32b vibrates, and achieving "free" vibration of the sound emitting backplane 32b within the space as much as possible. In some embodiments, the location of the fixed structure 40b provided by the display apparatus is not limited. In a specific embodiment, FIG. 35 is a schematic diagram illustrating a location of the fixed structure according to an embodiment of the present application, wherein, on the second side of the sound emitting backplane 32b, a plurality of fixed structures 40b are arranged on a plurality of predetermined columns respectively. By taking a first column on the left, a second column in the middle, and a third column on the right as an example, the second column in the middle may be arranged at a midline 320b of the left and right side directions of the sound emitting backplane 32b, such that the fixed structure on the second column may provide a certain isolation for sound emit from the sound channels on the left and right sides of the SoD panel.

According to the display apparatus in some embodiments, the sound emitting backplane is connected with the support structure by the plurality of floating fixed structures, and the gap with a certain distance is reserved between the sound emitting backplane and the support structure, showing a "floating" fixation effect, which is equivalent to that the display structure and the sound emitting backplane are fixed on the first side of the support structure in a floating manner, and the second side of the support structure may still be connected with a base or may be fixed on the wall by means of screw holes of a mounting bracket or the like, without affecting the overall design of the support structure and the display apparatus. In some embodiments, when the exciters of the display apparatus drives the sound emitting backplane and the display structure to vibrate to emit sound, the support structure cannot prevent the overall back and forth movement of the sound emitting backplane and the free vibration of the edges, so that the sound emitting backplane may vibrate within the gap between the sound emitting backplane and the support structure, thereby enhancing the sound emitting effect of the SoD panel and improving the user experience of the display apparatus.

Figure 36:
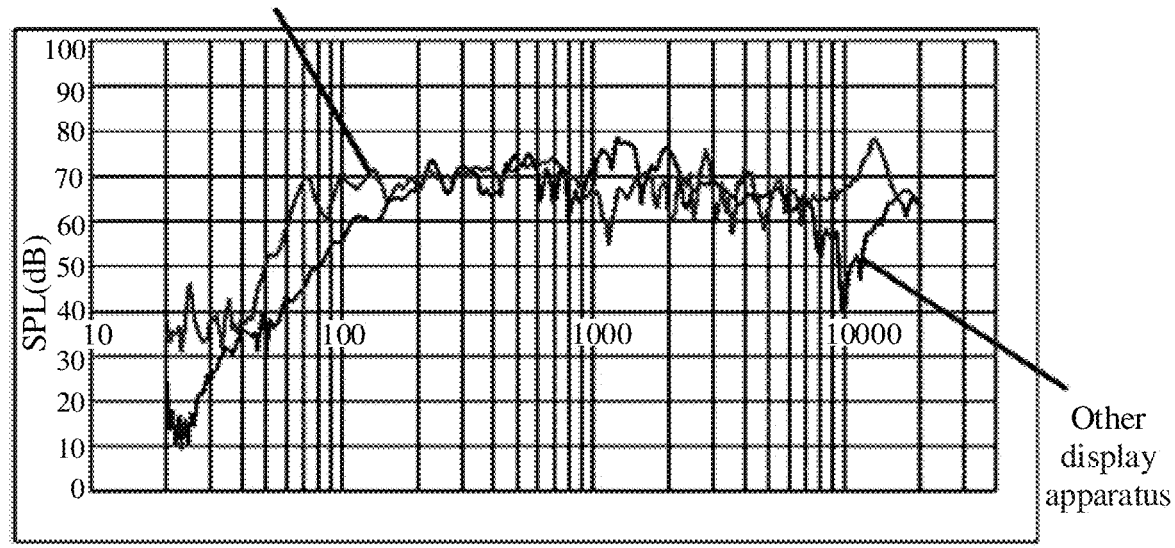
FIG. 36 is a schematic diagram illustrating a frequency response comparison of a display apparatus according to an embodiment of the present application.
Figure 37:
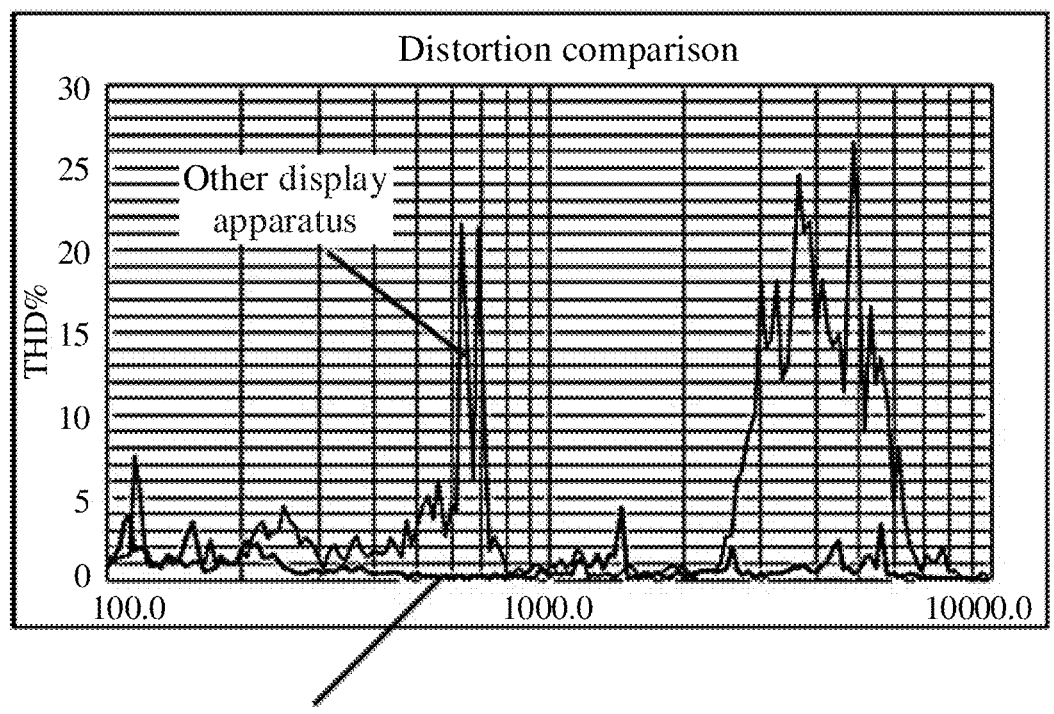
FIG. 37 is a schematic diagram illustrating a distortion comparison of a display apparatus according to an embodiment of the present application.

FIG. 36 is a schematic diagram illustrating a frequency response comparison of the display apparatus according to an embodiment of the present application, and FIG. 37 is schematic diagram illustrating a distortion comparison of the display apparatus according to an embodiment of the present application, wherein FIG. 36 shows a comparison of the frequency response (sound pressure level SPL) of sound emit from the display apparatus configured with a SoD panel, it can be seen that other display apparatuses have a narrow frequency response range as individual display panel fixed at four sides emit sound, while in some embodiments, since the SoD panel in the display apparatus has a mode similar to free boundary vibration, thanks to reducing obstruction of the support structure or other objects to panel vibration, a wider frequency response may be achieved. FIG. 37 shows a THD comparison, other display apparatuses have a greater distortion value at some frequencies as individual display panel fixed at four sides emit sound, while the display apparatus provided in some embodiments may achieve lower distortion since the obstruction of the display apparatus to panel vibration is reduced as well.

In some embodiments, in the display apparatuses as provided in FIGS. 33 and 34, the area of the support structure 35b may be smaller than that of the sound emitting backplane 32b, and the support structure 35b may not cover the entire sound emitting backplane 32b; in some embodiments, no support structure may be provided above, such that the second side of the sound emitting backplane 32b may be provided directly as a part of the appearance structure of the display apparatus, enabling the display apparatus to be lighter and thinner, reducing the overall weight of the display apparatus, further enriching the use effect of the display apparatus and improving the user experience.

In some embodiments, the display apparatus may be an OLED display apparatus, and in order to affix the OLED display structure and the sound emitting backplane of the OLED display apparatus, the embodiment of the present application also provides an adhesion structure for attaching the display structure and the sound emitting backplane.

Figure 38:
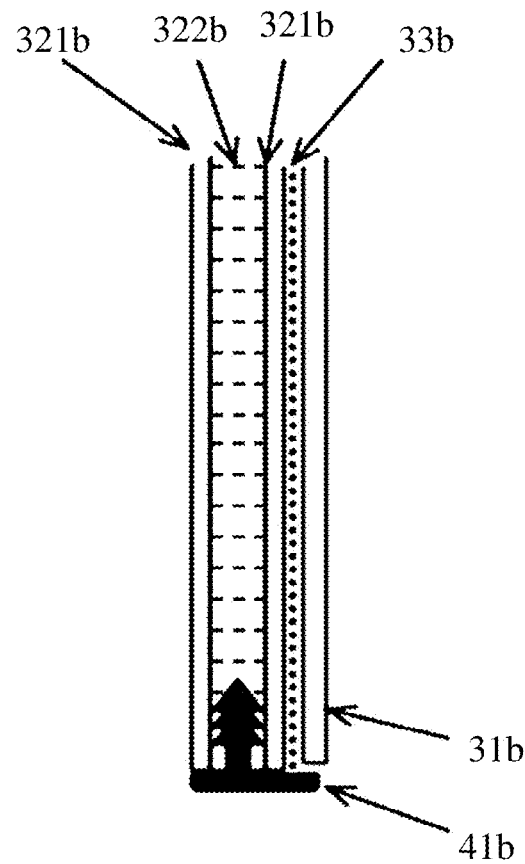
FIG. 38 is a structural schematic diagram illustrating a protective frame according to an embodiment of the present application.

In some embodiments, since the area of the support structure of the display apparatus provided is smaller than that of the sound emitting backplane, the support structure cannot provide protection for the sound emitting backplane in a full housing manner, and thus, in some embodiments, the upper and lower sides of the display apparatus may also be configured with protective frames to provide support and protection for the sound emitting backplane as well as the edges of the display structure. For example, FIG. 38 is a structural schematic diagram illustrating a protective frame according to an embodiment of the present application, taking a lower structure of the display apparatus as an example, the protective frame 41b may be connected with the intermediate layer in the sound emitting backplane 32b to provide protection for the sound emitting backplane 32b and the lower side of the display structure 31b.

In some embodiments, for example, the overall safety performance of the display apparatus is guaranteed, the service life of the display apparatus is prolonged, and further, the user experience is improved. Therefore, referring to the structure as shown in FIG. 34, the protective frame 41b arranged below may also provide protection for the lower edge of the display structure 31b together with the frame lower cover 351b and the buffer structure.

For the display apparatus provided in any one of the preceding embodiments of the present application, it is illustrated that the gap is formed between the sound emitting backplane and the support structure to allow greater freedom of vibration of the sound emitting backplane in the first and second side directions. However, in the display apparatus, the exciters serve as excitation devices for driving the sound emitting backplane to vibrate to emit sound, and may also be connected with the support structure, thereby utilizing the vibration energy on the second sides of the exciters to improve the sound emitting efficiency. Therefore, in the display apparatus provided by the present application, a sound emitting structure is arranged on the support structure, such that the exciters are attached to the sound emitting backplane on the first side, the sound emitting backplane and the display structure on the first side are driven to vibrate to emit sound, and meanwhile, the vibration generated can also drive the sound emitting structure attached to the second side to vibrate to emit sound. The back-and-forth vibrations of the exciters are similar, which is equivalent to that a speaker is also arranged on the second side of the display apparatus, thereby enabling the efficient utilization of vibration energy on the second sides of the exciters, further improving the energy efficiency of the display apparatus.

Figure 39:
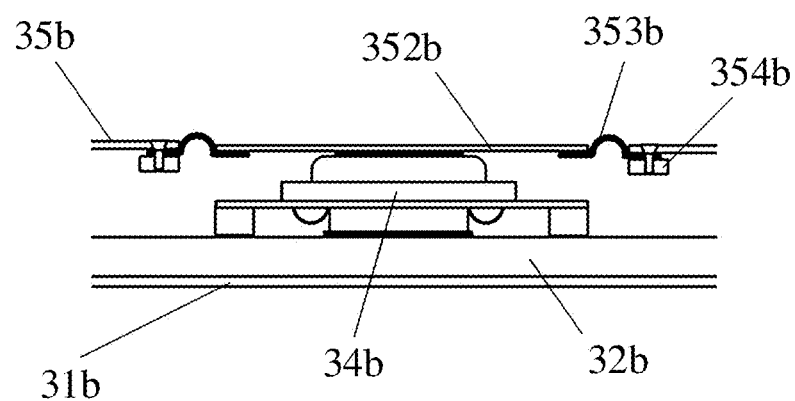
FIG. 39 is a structural schematic diagram illustrating a sound emitting structure according to an embodiment of the present application.

FIG. 39 is a structural schematic diagram illustrating a sound emitting structure according to an embodiment of the present application, and the structure as shown in FIG. 39 can be applied to the display apparatus in any one of the embodiments of the present application. The exciter 34$b$ as shown in FIG. 39 may be any exciter in the display apparatus, the display apparatus reserves a hollow location for the sound emitting structure at the relative location of the support structure 35$b$ and the exciter 34$b$, a plurality of screws 354$b$ are arranged around the periphery of the hollow location, and a flat vibration member 352$b$ is connected with ends of a plurality of rubber surrounds 353$b$, and the other ends of the plurality of rubber surrounds 353$b$ are connected with the corresponding screws 354$b$, thereby connecting the flat vibration member 352$b$ and the support structure 35$b$.

In some embodiments, the material of the flat vibration member 352$b$ may be made from metal, carbon fiber, fiberglass, plastic, or a honeycomb composite thereof. The thickness of the flat vibration member 352$b$ may range from 0.5 mm to 5 mm Thus, when the second side of the exciter 34$b$ is attached to the flat vibration member 352$b$, the exciter 34$b$ and the flat vibration member 352$b$, as well as the plurality of rubber surrounds 353$b$ jointly form a basic structure of a "sound radiator". When the first side of the exciter 34$b$ drives the sound emitting backplane 32$b$ and the display structure 31$b$ to vibrate to emit sound by way of the back-and-forth vibration, the vibration of the second side of the exciter 34$b$ can drive the attached flat vibration member 352$b$ to vibrate to emit sound. In this case, the support structure 35$b$ is also equivalent to a speaker arranged behind the display apparatus, thereby improving the energy utilization efficiency when the exciter 34$b$ vibrates, increasing the intensity of sound emit by the display apparatus as a whole, and further improving the energy efficiency of the display apparatus.

Figure 40:
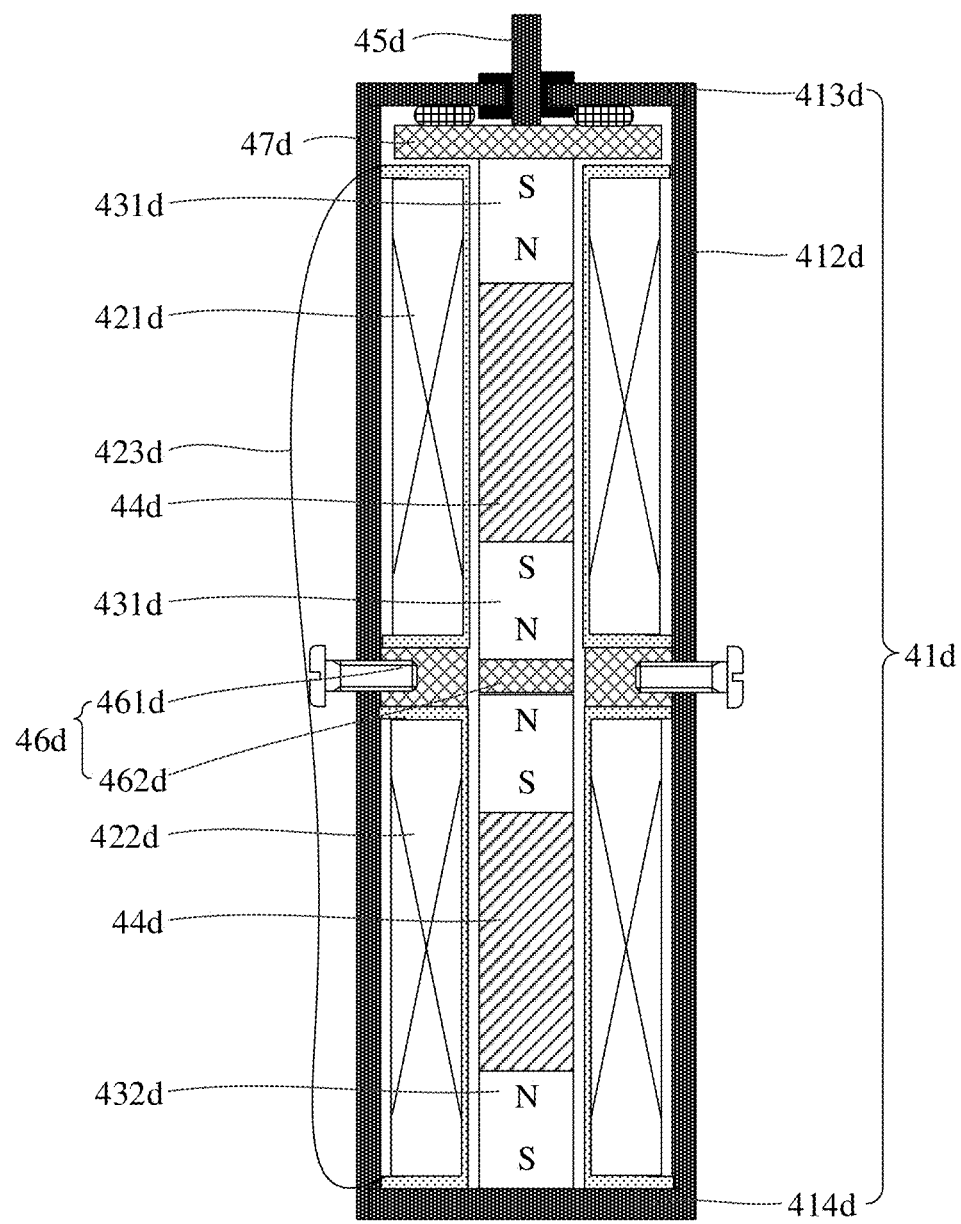
FIG. 40 is a structure diagram of an exciter.

In some embodiments, the above exciter may employ a design as follows. FIG. 40 is a structure diagram of the exciter. The exciter includes a housing 41$d$, coils, magnets, magnetostrictive elements 44$d$ and a vibration element 45$d$, wherein the housing 41$d$ encloses the coils for generating an alternating magnetic field in accordance with a control signal, the coils have a ring shape, the magnets and the magnetostrictive elements 44$d$ are located within the coils and are arranged along an axial direction of the coils, one end of the vibration element 45$d$ is located within the housing 41$d$ and the other end of the vibration element 45$d$ extends out of the housing 41$d$; the magnetostrictive elements 44$d$ can undergo a telescopic deformation along the axial direction of the coils in a superimposed magnetic field formed by the alternating magnetic field and the magnetic field generated by the magnets and drive the panel to vibrate to emit sound. The housing 41$d$ has a container shape and is configured to provide protection for the coils, the magnets, the magnetostrictive elements 44$d$, or the like. The material of the housing 41$d$ may be metal material, such as iron, such that the housing 41$d$ can serve as a magnetic yoke for magnetic lines to pass through. To facilitate assembly, the housing 41$d$ may include a cylinder 412$d$, and a first end cap 413$d$ as well as a second end cap 414$d$ capped at two openings of the cylinder 412$d$, wherein the first end cap 413$d$ and the second end cap 414$d$ are detachably connected with the cylinder 412$d$, for example the first end cap 413$d$ and the second end cap 414$d$ may be screwed directly to the cylinder 412$d$, or connected with the cylinder 412$d$ by threaded fasteners.

In some embodiments, the second end cap 414$d$ can serve as a support element to support the coils which can be adhesively fixed to the second end cap 414$d$ by an adhesion element, and the first end cap 413$d$ is configured with a through hole through which the vibration element 45$d$ passes. The coils are connected with an external power supply and an amplifier for receiving a control signal and generating the alternating magnetic field in accordance with the control signal. The magnets may be permanent magnets or the like, the magnetic field generated by the magnets may be referred to as a static magnetic field, and the material of the magnetostrictive element 44$d$ may be a ferromagnetic material, a soft magnetic material, or the like that is well known to those skilled in the art. The coils, magnets, and magnetostrictive elements 44$d$ can be of a type well known to those skilled in the art, which is not limited by the embodiment. The static magnetic field is configured to provide a static working point for the magnetostrictive elements 44$d$, the alternating magnetic field provides a dynamic working space for the magnetostrictive elements 44$d$ whose expansion coefficients show periodic increase or reduction as the strength of the superimposed magnetic field of the alternating magnetic field and the static magnetic field varies periodically, thereby driving the vibration element 45$d$ to move back and forth, and causing the panel to vibrate by the vibration element 45$d$. The axes of the coils are arranged parallel to the axis of the cylinder 412$d$. In the embodiment, the magnets and the magnetostrictive elements 44$d$ are bar-shaped or rod-shaped elements and are accommodated in the coils, and the magnets and the magnetostrictive elements 44$d$ are arranged along the axial direction of the coils. The vibration element 45$d$ may be a rod-shaped element and pass through the through hole so that one end of the vibration element 45$d$ is located inside the housing 41$d$ and the other end of the vibration element 45$d$ extends out of the housing 41$d$. The end located inside the housing 41$d$ can extend into the coils along the axial direction of the coils or abuts against the magnets or the magnetostrictive elements 44$d$.

In some embodiments, the magnets or the magnetostrictive elements 44$d$ can also extend out of the coils, and in this case, in order to avoid a rigid impact between the magnet or magnetostrictive elements 44$d$ and the first end cap 413$d$, a resilient bumper, for example a rubber pad, a silicone pad, a concentric-square-shaped spring, disc spring, or the like, can also be arranged between the coils and the first end cap 413$d$, Of course, one end of the vibration element 45$d$ located inside the housing 41$d$ can also be configured with a vertically connected contact plate that abuts against the magnets or magnetostrictive elements 44$d$, and the resilient bumper is arranged between the contact plate and the first end cap 413$d$. A sealing element may also be arranged between the vibration element 45$d$ and the through hole, and is arranged outside the vibration element 45$d$ in a sleeving manner to form a seal against the housing 41$d$, and the sealing element may be an elastic rubber piece to mitigate the impact of the vibration element 45$d$ to the first end cap 413$d$. Since the resilient bumper is spaced between the magnets and the first end cap 413d, in order to avoid disconnection of a magnetic circuit, a second magnetic yoke 47d may be further arranged between the contact plate and the coils, or between the resilient bumper and the coils. In order to drive the vibration element 45d to vibrate, after the magnet and the magnetostrictive element 44d are stacked on the second end cap 414d, the other side of the vibration element 45d can extend out of the coils and abut against the vibration element 45d. That is, the magnet, the magnetostrictive element 44d and the vibration element 45d are stacked on the second end cap 414d and are compressed between the panel and the second end cap 414d to avoid separation of any adjacent two of the magnet, the magnetostrictive element 44d and the vibration element 45d in the process that the panel is driven to vibrate by the vibration element 45d.

As for the arrangement mode where the magnets surround the outside of the coils in the related art, the exciters in the present embodiment are arranged inside the coils, and the magnets and the magnetostrictive elements 44d are arranged in parallel along the axial direction of the coils, reducing the sizes of the exciters along a radial direction of the coil, and the thickness of the display apparatus is reduced accordingly.

In some embodiments, the coils include a first coil 421d and a second coil 422d arranged coaxially. The first coil 421d and the second coil 422d may be connected in series or in parallel by an electrical connection line, and the connected first coil 421d and second coil 422d are connected with the external power supply, the amplifier, and other components. The first coil 421d and the second coil 422d may also be respectively connected with the external power supply, the amplifier, and other components through electrical connection lines. The first coil 421d and the second coil 422d which are coaxially arranged may increase the strength of the alternating magnetic field, such that the magnetic flux at the location of the vibration element 45d is increased, the amount of expansion of the magnetostrictive elements 44d is increased, which contributes to driving the panel to vibrate to emit sound; and the intensity of sound emit by the panel is higher, that is, the sound emitting effect of the display apparatus is optimized without increasing the sizes of the exciters. It can be understood that the coils are formed by winding copper wires, parameters such as the number of turns of the coils, and the diameters of the copper wires are different, and the coils have different inductance magnitudes, and the inductance tends to cause lost to the coils, resulting in low efficiency of the coils.

In some embodiments, a winding direction of the first coil 421d and a winding direction of the second coil 422d are opposite, and the first coil 421d and the second coil 422d are connected with each other in series through an electrical connection line 423d. In this way, the inductance of the first coil 421d and the inductance of the second coil 422d may partially counteract each other, when the first coil 421d and the second coil 422d have the same structure, the inductance of the first coil 421d and the inductance of the second coil 422d can be approximately counteracted, and the coils serve as a purely resistive load, which effectively boosts the high frequency response of the exciters, thereby extending the frequency bandwidth of the exciters.

In some embodiments, the magnets include a first magnet 431d arranged inside the first coil 421d, and a second magnet 432d arranged inside the second coil 422d, and polarities of ends, facing the vibration element 45d, of the first magnet 431d and the second magnet 432d are opposite. When the winding directions of the first coil 421d and the second coil 422d are opposite, the alternating magnetic fields generated by the first coil 421d and the second coil 422d are opposite in direction when the external control signal is introduced. Correspondingly, arrangement directions of the first magnet 431d and second magnet 432d corresponding to the first coil 421d and the second coil 422d are also opposite so that the first coil 421d and the first magnet 431d, as well as the second coil 422d and the second magnet 432d can respectively form two independent superimposed magnetic fields.

In some embodiments, there are a plurality of first magnets 431d, the plurality of first magnets 431d are arranged at intervals along the axial direction of the first coil 421d, the polarities of the ends, facing the vibration element 45d, of the plurality of first magnets 431d are the same, and a magnetostrictive element 44d is arranged between two adjacent first magnets 431d. There is a plurality of second magnets 432d, the plurality of second magnets 432d are arranged at intervals along the axial direction of the second coil 422d, the polarities of the ends, facing the vibration element 45d, of the plurality of second magnets 432d are the same, and a magnetostrictive element 44d is arranged between two adjacent second magnets 432d. Since the first coil 421d and the second coil 422d in the exciter are arranged coaxially, the length of the exciter is greater than the radial size of the exciter, that is, the exciter is in an elongated rod-like structure, to avoid less magnetic flux at each of the locations of the magnetostrictive elements 44d. In the embodiment, the first coil 421d is configured with a plurality of first magnets 431d correspondingly, and the second coil 422d is configured with a plurality of second magnets 432d correspondingly, and one magnetostrictive element 44d is arranged between the two adjacent first magnets 431d, and one magnetostrictive element 44d is arranged between the two adjacent second magnets 432d, so that the magnetic flux at each of the locations of the magnetostrictive elements 44d is greater, which can generate a greater force to drive the panel to vibrate.

In some embodiments, a first magnetic yoke 46d is arranged between the adjacent first magnet 431d and second magnet 432d, and is connected with the housing 41d to form a closed magnetic circuit through which the magnetic lines generated by the coils can pass to avoid magnetic leakage. Opposite ends of the first magnet 431d and the second magnet 432d have the same polarity, the first magnetic yoke 46d arranged between the first magnet 431d and the second magnet 432d may allow the magnetic lines of the magnetic fields generated by the first coil 421d and the second coil 422d on the two sides as well as the first magnet 431d and the second magnet 432d to pass. Since the magnets may move with the magnetostrictive elements 44d, the first magnetic yoke 46d may include a movable part 462d and a fixed part 461d, wherein the movable part 462d is arranged between the first magnet 431d and the second magnet 432d and can follow the magnetostrictive elements 44d to move, and the fixed part 461d is arranged between the first coil 421d and the second coil 422d and can be fixedly connected with the housing 41d, for example, can be fixed by threaded fasteners. With a gap between the movable part 462d and the fixed part 461d, relative movement between the movable part 462d and the fixed part 461d are made more convenient and excessive amount of magnetic leakage can be prevented as well.

In some embodiments, the magnetostrictive elements 44d are relatively fixed with the magnets. The relatively fixed magnetostrictive elements 44d and magnets move relative to the coils as a whole, with the ends abutting against the vibration element 45d and the other ends abutting against the second end cap 414d. The magnetostrictive elements 44d may be connected with the magnets by in a manner of clamping, screwing, etc., or may be adhesively fixed to the magnets by adhesion elements. The magnetostrictive elements 44d are fixed relative to the magnets such that a plurality of independent components arranged along the axial direction of the coil can be fixed as a whole and move telescopically with the magnetostrictive elements 44d to avoid separation and gaps between the adjacent magnetostrictive elements 44d and magnets when the exciters vibrate, which may cause impact noise and the like.

In some embodiments, the housing 41d is also filled with a heat-conducting medium that can transfer heat generated by the coils to the housing 41d. In this way, heat generated in the coils can be transferred to the housing 41d through the heat-conducting medium in time and then is dissipated to the air through the housing 41d, avoiding overheating of the coils. The heat-conducting medium may be of a type well known to those skilled in the art, such as heat-conducting silicone which is easily curable, or liquid heat dissipating oil.

The above description, for convenience of explanation, has been done in combination with specific embodiments. However, the above illustrative discussions are not intended to be exhaustive or to limit implementations to the specific forms disclosed above. Multiple modifications and variations are possible in light of the above teachings. The foregoing embodiments are chosen and described in order to better explain the principle and practical applications, thereby enabling those skilled in the art to better utilize the embodiments and various variations.

What is claimed is:

1. A display apparatus, comprising:
   a display structure, a sound emitting substrate, and a plurality of electromagnetic exciters;
   wherein the display structure is configured to receive and display optical signals;
   the sound emitting substrate is attached to the display structure and is divided into a plurality of regions by a plurality of isolation zones, at least some of the plurality of regions are attached to at least one of the plurality of electromagnetic exciters, the sound emitting substrate comprises an intermediate layer, and a first isolation zone of the plurality of isolation zones comprise a plurality of grooves formed in two side surfaces of the intermediate layer; and
   the plurality of electromagnetic exciters are configured to generate bending waves at an area where the plurality of electromagnetic exciters are attached to the sound emitting substrate, and the bending waves are propagated in regions where the plurality of electromagnetic exciters are attached to the sound emitting substrate to enable the regions and a portion of the display structure attached with the regions to vibrate and emit sound.

2. The display apparatus according to claim 1, wherein the first isolation zone comprises a first groove in each of the two side surfaces of the intermediate layer, and the plurality of grooves in the two side surfaces of the intermediate layer are staggered and parallel, and
   a depth direction of the first groove is perpendicular to a surface of the sound emitting substrate, and an extension direction of the first groove is the same as an extension direction of the first isolation zone.

3. The display apparatus according to claim 2, wherein a depth of the first groove is greater than or equal to half of a thickness of the sound emitting substrate.

4. The display apparatus according to claim 3, wherein the sound emitting substrate comprises a first skin, a first coating layer, the intermediate layer, a second coating layer, and a second skin; the first skin and the first coating layer are attached to one side of the intermediate layer in sequence, and the second skin and the second coating layer are attached to the other side of the intermediate layer in sequence;
   the first skin and the second skin are configured to wrap the intermediate layer, the first coating layer is configured to connect the first skin and the intermediate layer, and the second coating layer is configured to connect the second skin and the intermediate layer.

5. The display apparatus according to claim 3, wherein the display structure is attached to one side surface of the sound emitting substrate.

6. The display apparatus according to claim 4, wherein the intermediate layer is made from a foamed plastic core material.

7. The display apparatus according to claim 5, wherein the intermediate layer is a foamed plastic core material.

8. The display apparatus according to claim 6, wherein the foamed plastic core material comprises polymethacrylimide (PMI), or hard polystyrene.

9. The display apparatus according to claim 4, wherein the first skin is made from fiberglass, carbon fiber, hybrid glass-carbon fiber, plastic, or lightweight aluminum.

10. The display apparatus according to claim 4, wherein the second skin is made from fiberglass, carbon fiber, hybrid glass-carbon fiber, plastic, or lightweight aluminum.

11. The display apparatus according to claim 1, wherein the display structure comprises OLED panel.

12. The display apparatus according to claim 11, wherein an area of the sound emitting substrate is less than an area of the display structure.

* * * * *